(12) United States Patent
Van De Ven et al.

(10) Patent No.: US 9,417,478 B2
(45) Date of Patent: Aug. 16, 2016

(54) LIGHTING DEVICE AND LIGHTING METHOD

(71) Applicant: CREE, INC., Durham, NC (US)

(72) Inventors: Antony Paul Van De Ven, Sai Kung (CN); Gerald H. Negley, Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/859,855

(22) Filed: Apr. 10, 2013

(65) Prior Publication Data

US 2013/0235303 A1  Sep. 12, 2013

Related U.S. Application Data

(63) Continuation of application No. 11/736,761, filed on Apr. 18, 2007, now Pat. No. 8,513,875.

(60) Provisional application No. 60/792,859, filed on Apr. 18, 2006, provisional application No. 60/793,524, filed on Apr. 20, 2006, provisional application No. 60/868,134, filed on Dec. 1, 2006.

(51) Int. Cl.
   *H01J 1/62* (2006.01)
   *G02F 1/1335* (2006.01)
   *F21K 99/00* (2016.01)
   (Continued)

(52) U.S. Cl.
   CPC ............ *G02F 1/133617* (2013.01); *F21K 9/00* (2013.01); *H01L 33/08* (2013.01); *F21Y 2101/02* (2013.01); *H01L 2924/0002* (2013.01)

(58) Field of Classification Search
   USPC ............................................... 313/498–509
   See application file for complete search history.

(56) References Cited

U.S. PATENT DOCUMENTS

| 3,805,937 A | 4/1974 | Hatanaka et al. |
| 3,875,456 A | 4/1975 | Kano et al. |

(Continued)

FOREIGN PATENT DOCUMENTS

| DE | 3 916 875 | 12/1990 |
| DE | 3916875 | 12/1990 |

(Continued)

OTHER PUBLICATIONS

U.S. Appl. No. 11/613,692, filed Dec. 20, 2006.

(Continued)

*Primary Examiner* — Nimeshkumar Patel
*Assistant Examiner* — Brenitra M Lee
(74) *Attorney, Agent, or Firm* — Burr & Brown, PLLC

(57) ABSTRACT

A lighting device comprising first and second groups of solid state light emitters, which emit light having peak wavelength in ranges of from 430 nm to 480 nm and from 600 nm to 630 nm, respectively, and a first group of lumiphors which emit light having dominant wavelength in the range of from 555 nm to 585 nm. In some embodiments, if current is supplied to a power line, a combination of (1) light exiting the lighting device which was emitted by the first group of emitters, and (2) light exiting the lighting device which was emitted by the first group of lumiphors would, in an absence of any additional light, produce a sub-mixture of light having x, y color coordinates within an area on a 1931 CIE Chromaticity Diagram defined by points having coordinates (0.32, 0.40), (0.36, 0.48), (0.43, 0.45), (0.42, 0.42), (0.36, 0.38). Also provided is a method of lighting.

17 Claims, 4 Drawing Sheets

Figure 1:
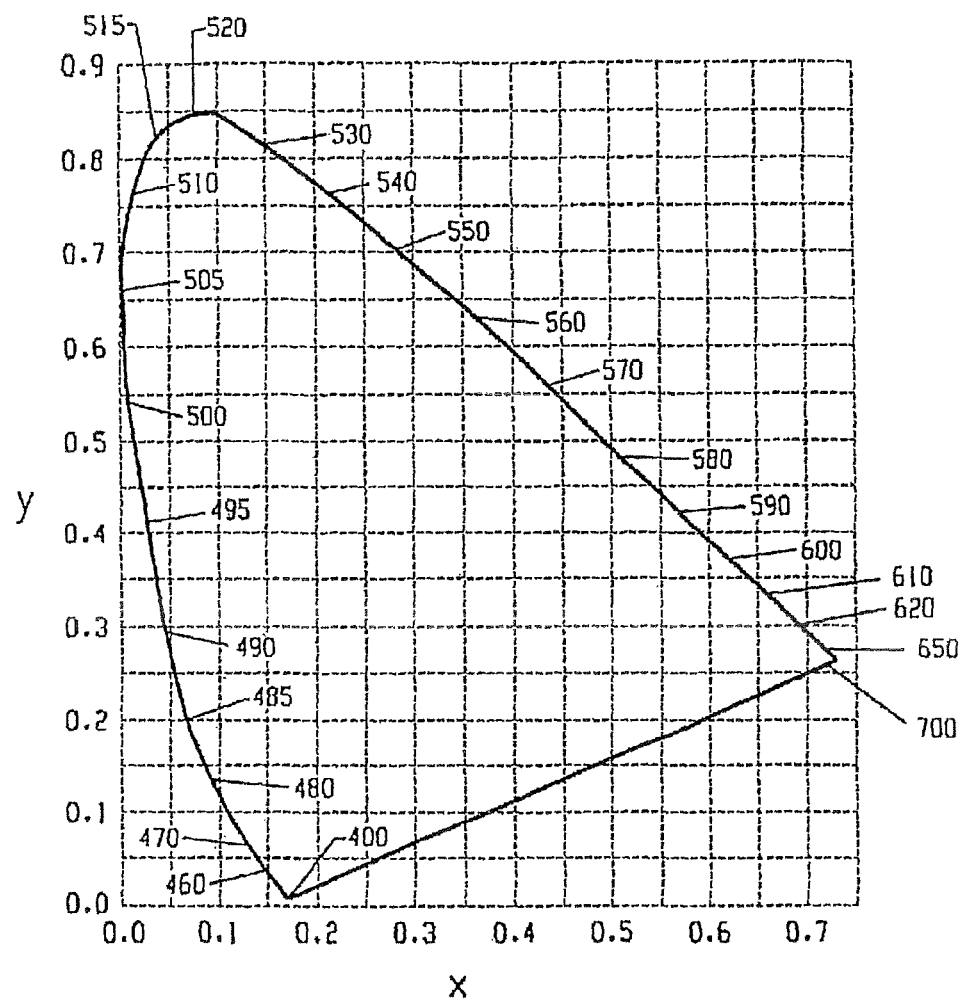

(51) Int. Cl.
*H01L 33/08* (2010.01)
*F21Y 101/02* (2006.01)

(56) References Cited

U.S. PATENT DOCUMENTS

| | | | |
|---|---|---|---|
| 3,927,290 A | 12/1975 | Denley |
| 4,120,026 A | 10/1978 | Tsuchihashi et al. |
| 4,325,146 A | 4/1982 | Lennington |
| 4,408,157 A | 10/1983 | Beaubien |
| 4,420,398 A | 12/1983 | Castino |
| 4,710,699 A | 12/1987 | Miyamoto |
| 4,772,885 A | 9/1988 | Uehara et al. |
| 5,087,883 A | 2/1992 | Hoffman |
| 5,166,815 A | 11/1992 | Elderfield |
| 5,264,997 A | 11/1993 | Hutchisson et al. |
| 5,384,519 A | 1/1995 | Gotoh |
| 5,407,799 A | 4/1995 | Studier |
| 5,410,519 A | 4/1995 | Hall et al. |
| 5,477,436 A | 12/1995 | Bertling et al. |
| 5,563,849 A | 10/1996 | Hall et al. |
| 5,803,579 A | 9/1998 | Turnbull et al. |
| 5,851,063 A | 12/1998 | Doughty et al. |
| 5,959,316 A | 9/1999 | Lowery |
| 6,066,861 A | 5/2000 | Hohn et al. |
| 6,076,936 A | 6/2000 | George |
| 6,084,250 A | 7/2000 | Justel et al. |
| 6,095,666 A | 8/2000 | Salam |
| 6,132,072 A | 10/2000 | Turnbull et al. |
| 6,153,971 A | 11/2000 | Shimizu et al. |
| 6,212,213 B1 | 4/2001 | Weber et al. |
| 6,234,648 B1 | 5/2001 | Börner et al. |
| 6,252,254 B1 | 6/2001 | Soules |
| 6,255,670 B1 | 7/2001 | Srivastava et al. |
| 6,278,135 B1 | 8/2001 | Srivastava et al. |
| 6,283,612 B1 | 9/2001 | Hunter |
| 6,292,901 B1 | 9/2001 | Lys et al. |
| 6,294,800 B1 | 9/2001 | Duggal et al. |
| 6,319,425 B1 | 11/2001 | Tasaki et al. |
| 6,335,538 B1 | 1/2002 | Prutchi et al. |
| 6,337,536 B1 | 1/2002 | Matsubara et al. |
| 6,348,766 B1 | 2/2002 | Ohishi et al. |
| 6,350,041 B1 | 2/2002 | Tarsa et al. |
| 6,357,889 B1 | 3/2002 | Duggal et al. |
| 6,394,621 B1 | 5/2002 | Hanewinkel |
| 6,429,583 B1 | 8/2002 | Levinson et al. |
| 6,441,558 B1 | 8/2002 | Muthu et al. |
| 6,441,582 B1 | 8/2002 | Powers |
| 6,480,299 B1 | 11/2002 | Drakopoulos et al. |
| 6,501,091 B1 | 12/2002 | Bawendi et al. |
| 6,501,100 B1 | 12/2002 | Srivastava et al. |
| 6,504,179 B1 | 1/2003 | Ellens et al. |
| 6,513,949 B1 | 2/2003 | Marshall et al. |
| 6,522,065 B1 | 2/2003 | Srivastava et al. |
| 6,538,371 B1 | 3/2003 | Duggal et al. |
| 6,550,949 B1 | 4/2003 | Bauer et al. |
| 6,552,495 B1 | 4/2003 | Chang |
| 6,577,073 B2 | 6/2003 | Shimizu et al. |
| 6,578,986 B2 | 6/2003 | Swaris et al. |
| 6,592,810 B2 | 7/2003 | Nishida et al. |
| 6,600,175 B1 | 7/2003 | Baretz et al. |
| 6,600,324 B2 | 7/2003 | St-Germain |
| 6,603,258 B1 | 8/2003 | Mueller-Mach et al. |
| 6,608,485 B2 | 8/2003 | St-Germain |
| 6,616,862 B2 | 9/2003 | Srivastava et al. |
| 6,624,350 B2 | 9/2003 | Nixon et al. |
| 6,636,003 B2 | 10/2003 | Rahm et al. |
| 6,642,666 B1 | 11/2003 | St-Germain |
| 6,685,852 B2 | 2/2004 | Setlur et al. |
| 6,686,691 B1 | 2/2004 | Mueller et al. |
| 6,692,136 B2 | 2/2004 | Marshall et al. |
| 6,703,173 B2 | 3/2004 | Lu et al. |
| 6,712,486 B1 | 3/2004 | Popovich et al. |
| 6,734,465 B1 | 5/2004 | Taskar et al. |
| 6,737,801 B2 | 5/2004 | Ragle |
| 6,744,194 B2 | 6/2004 | Fukasawa et al. |
| 6,762,562 B2 | 7/2004 | Leong |
| 6,762,563 B2 | 7/2004 | St-Germain |
| 6,784,463 B2 | 8/2004 | Camras et al. |
| 6,791,257 B1 | 9/2004 | Sato et al. |
| 6,803,719 B1 | 10/2004 | Miller et al. |
| 6,817,735 B2 | 11/2004 | Shimizu et al. |
| 6,841,804 B1 | 1/2005 | Chen et al. |
| 6,851,834 B2 | 2/2005 | Leysath |
| 6,880,954 B2 | 4/2005 | Ollett et al. |
| 6,882,101 B2 | 4/2005 | Ragle |
| 6,890,777 B2 | 5/2005 | Bawendi et al. |
| 6,914,265 B2 | 7/2005 | Bawendi et al. |
| 6,914,267 B2 | 7/2005 | Fukasawa et al. |
| 6,936,857 B2 | 8/2005 | Doxsee et al. |
| 6,967,116 B2 | 11/2005 | Negley |
| 6,980,176 B2 | 12/2005 | Matsumoto et al. |
| 7,005,679 B2 | 2/2006 | Tarsa et al. |
| 7,008,078 B2 | 3/2006 | Shimizu et al. |
| 7,009,343 B2 | 3/2006 | Lim et al. |
| 7,014,336 B1 | 3/2006 | Ducharme et al. |
| 7,023,019 B2 | 4/2006 | Maeda et al. |
| 7,061,454 B2 | 6/2006 | Sasuga et al. |
| 7,066,623 B2 | 6/2006 | Lee et al. |
| 7,083,302 B2 | 8/2006 | Chen et al. |
| 7,093,958 B2 | 8/2006 | Coushaine |
| 7,095,056 B2 | 8/2006 | Vitta et al. |
| 7,102,172 B2 | 9/2006 | Lynch et al. |
| 7,116,308 B1 | 10/2006 | Heeks et al. |
| 7,118,262 B2 | 10/2006 | Negley et al. |
| 7,125,143 B2 | 10/2006 | Hacker |
| 7,135,664 B2 | 11/2006 | Vornsand et al. |
| 7,144,121 B2 | 12/2006 | Minano et al. |
| 7,164,231 B2 | 1/2007 | Choi et al. |
| 7,207,691 B2 | 4/2007 | Lee et al. |
| 7,213,940 B1 | 5/2007 | Van de Ven et al. |
| 7,215,074 B2 | 5/2007 | Shimizu et al. |
| 7,232,212 B2 | 6/2007 | Iwase |
| 7,239,085 B2 | 7/2007 | Kawamura |
| 7,250,715 B2 | 7/2007 | Meuller et al. |
| 7,255,457 B2 | 8/2007 | Ducharme et al. |
| 7,256,557 B2 | 8/2007 | Lim |
| 7,264,527 B2 | 9/2007 | Bawendi et al. |
| 7,322,732 B2 | 1/2008 | Negley et al. |
| 7,329,024 B2 | 2/2008 | Lynch et al. |
| 7,354,172 B2 | 4/2008 | Chemel et al. |
| 7,358,954 B2 | 4/2008 | Negley et al. |
| 7,365,485 B2 | 4/2008 | Fukasawa et al. |
| 7,387,405 B2 | 6/2008 | Ducharme et al. |
| 7,422,504 B2 | 9/2008 | Maeda et al. |
| 7,453,195 B2 | 11/2008 | Radkov |
| 7,474,044 B2 | 1/2009 | Ge |
| 7,642,708 B2 | 1/2010 | Juestel et al. |
| 7,692,373 B2 | 4/2010 | Bawendi et al. |
| 7,718,991 B2 | 5/2010 | Negley |
| 7,722,220 B2 | 5/2010 | Van de Ven |
| 7,852,010 B2 | 12/2010 | Negley |
| 7,862,214 B2 | 1/2011 | Trott |
| 7,959,329 B2 | 6/2011 | Van de Ven |
| 7,969,097 B2 | 6/2011 | Van de Ven |
| 8,008,676 B2 | 8/2011 | Negley |
| 8,011,818 B2 | 9/2011 | Negley |
| 8,029,155 B2 | 10/2011 | Van de Ven et al. |
| 8,033,692 B2 | 10/2011 | Negley |
| 8,053,972 B2 | 11/2011 | Bawendi et al. |
| 8,096,670 B2 | 1/2012 | Trott |
| 8,148,897 B2 | 4/2012 | Cho et al. |
| 8,174,181 B2 | 5/2012 | Bawendi et al. |
| 8,247,263 B2 | 8/2012 | Braune et al. |
| 8,283,904 B2 | 10/2012 | Myers |
| 8,362,684 B2 | 1/2013 | Bawendi et al. |
| 8,439,531 B2 | 5/2013 | Trott |
| 8,513,875 B2 | 8/2013 | Van de Ven |
| 8,827,507 B2 | 9/2014 | Van de Ven |
| 2001/0002049 A1 | 5/2001 | Reeh et al. |
| 2002/0006044 A1 | 1/2002 | Harbers et al. |
| 2002/0070681 A1 | 6/2002 | Shimizu et al. |
| 2002/0087532 A1 | 7/2002 | Barritz et al. |
| 2002/0140880 A1 | 10/2002 | Weindorf et al. |
| 2002/0149576 A1 | 10/2002 | Tanaka et al. |

(56) References Cited

U.S. PATENT DOCUMENTS

| | | |
|---|---|---|
| 2003/0026096 A1 | 2/2003 | Ellens et al. |
| 2003/0030063 A1 | 2/2003 | Sosniak et al. |
| 2003/0067773 A1 | 4/2003 | Marshall et al. |
| 2003/0127659 A1 | 7/2003 | Bawendi et al. |
| 2003/0127660 A1 | 7/2003 | Bawendi et al. |
| 2003/0146411 A1 | 8/2003 | Srivastava et al. |
| 2003/0218180 A1 | 11/2003 | Fujiwara |
| 2003/0222268 A1 | 12/2003 | Yocom et al. |
| 2004/0046178 A1 | 3/2004 | Sano |
| 2004/0104391 A1 | 6/2004 | Maeda et al. |
| 2004/0105261 A1 | 6/2004 | Ducharme et al. |
| 2004/0105264 A1 | 6/2004 | Spero |
| 2004/0113875 A1 | 6/2004 | Miller et al. |
| 2004/0179366 A1 | 9/2004 | Takeda et al. |
| 2004/0212998 A1 | 10/2004 | Mohacsi |
| 2004/0217364 A1 | 11/2004 | Tarsa et al. |
| 2004/0218387 A1 | 11/2004 | Gerlach |
| 2004/0218388 A1 | 11/2004 | Suzuki |
| 2004/0239839 A1 | 12/2004 | Hong |
| 2004/0259363 A1 | 12/2004 | Bawendi et al. |
| 2004/0264193 A1 | 12/2004 | Okumura |
| 2004/0264212 A1 | 12/2004 | Chung et al. |
| 2005/0007306 A1 | 1/2005 | Iisaka et al. |
| 2005/0030744 A1 | 2/2005 | Ducharme et al. |
| 2005/0052378 A1 | 3/2005 | Hacker |
| 2005/0082974 A1 | 4/2005 | Fukasawa et al. |
| 2005/0093442 A1 | 5/2005 | Setlur et al. |
| 2005/0110034 A1 | 5/2005 | Fujiwara |
| 2005/0117334 A1 | 6/2005 | Lee et al. |
| 2005/0127381 A1 | 6/2005 | Vitta et al. |
| 2005/0190141 A1 | 9/2005 | Roth et al. |
| 2005/0231976 A1 | 10/2005 | Keuper et al. |
| 2005/0243556 A1 | 11/2005 | Lynch |
| 2005/0251698 A1 | 11/2005 | Lynch et al. |
| 2005/0259423 A1 | 11/2005 | Heuser et al. |
| 2005/0274972 A1 | 12/2005 | Roth et al. |
| 2006/0012989 A1 | 1/2006 | Lee |
| 2006/0022582 A1 | 2/2006 | Radkov |
| 2006/0060872 A1 | 3/2006 | Edmond et al. |
| 2006/0067073 A1 | 3/2006 | Ting |
| 2006/0091778 A1 | 5/2006 | Setlur et al. |
| 2006/0105482 A1 | 5/2006 | Alferink et al. |
| 2006/0113548 A1 | 6/2006 | Chen et al. |
| 2006/0138435 A1 | 6/2006 | Tarsa et al. |
| 2006/0138937 A1 | 6/2006 | Ibbetson |
| 2006/0152140 A1 | 7/2006 | Brandes |
| 2006/0152172 A9 | 7/2006 | Mueller et al. |
| 2006/0180818 A1 | 8/2006 | Nagai et al. |
| 2006/0181192 A1 | 8/2006 | Radkov |
| 2006/0221635 A1 | 10/2006 | Sohn et al. |
| 2006/0245184 A1 | 11/2006 | Galli |
| 2007/0001188 A1 | 1/2007 | Lee |
| 2007/0001994 A1 | 1/2007 | Roth |
| 2007/0041220 A1 | 2/2007 | Lynch |
| 2007/0051966 A1 | 3/2007 | Higashi et al. |
| 2007/0090381 A1 | 4/2007 | Otsuka et al. |
| 2007/0137074 A1 | 6/2007 | Van De Ven et al. |
| 2007/0139920 A1 | 6/2007 | Van De Ven et al. |
| 2007/0139923 A1 | 6/2007 | Negley |
| 2007/0159091 A1 | 7/2007 | Hirosaki et al. |
| 2007/0170447 A1 | 7/2007 | Negley |
| 2007/0171145 A1 | 7/2007 | Coleman et al. |
| 2007/0202623 A1 | 8/2007 | Gao |
| 2007/0223219 A1 | 9/2007 | Medendorp et al. |
| 2007/0236911 A1 | 10/2007 | Negley |
| 2007/0247414 A1 | 10/2007 | Robert |
| 2007/0247847 A1 | 10/2007 | Villard |
| 2007/0262337 A1 | 11/2007 | Villard |
| 2007/0263393 A1 | 11/2007 | Van De Ven et al. |
| 2007/0267983 A1 | 11/2007 | Van De Ven et al. |
| 2007/0274063 A1 | 11/2007 | Negley |
| 2007/0274080 A1 | 11/2007 | Negley et al. |
| 2007/0276606 A1 | 11/2007 | Radkov |
| 2007/0278503 A1 | 12/2007 | Van De Ven et al. |
| 2007/0278934 A1 | 12/2007 | Van De Ven et al. |
| 2007/0278974 A1 | 12/2007 | Van De Ven |
| 2007/0279440 A1 | 12/2007 | Negley |
| 2007/0279903 A1 | 12/2007 | Negley |
| 2007/0280624 A1 | 12/2007 | Negley et al. |
| 2008/0084685 A1 | 4/2008 | Van de Ven et al. |
| 2008/0084700 A1 | 4/2008 | Van De Ven |
| 2008/0084701 A1 | 4/2008 | Van De Ven et al. |
| 2008/0088248 A1 | 4/2008 | Myers |
| 2008/0089053 A1 | 4/2008 | Negley |
| 2008/0106895 A1 | 5/2008 | Van de Ven et al. |
| 2008/0106907 A1 | 5/2008 | Trott et al. |
| 2008/0112168 A1 | 5/2008 | Pickard |
| 2008/0112170 A1 | 5/2008 | Trott et al. |
| 2008/0112183 A1 | 5/2008 | Negley |
| 2008/0130265 A1 | 6/2008 | Negley |
| 2008/0130285 A1 | 6/2008 | Negley |
| 2008/0136313 A1 | 6/2008 | Van de Ven et al. |
| 2008/0137347 A1 | 6/2008 | Trott et al. |
| 2008/0149957 A1 | 6/2008 | Kameshima et al. |
| 2008/0170396 A1 | 7/2008 | Yuan et al. |
| 2008/0174233 A1 | 7/2008 | Bawendi et al. |
| 2008/0179602 A1 | 7/2008 | Negley |
| 2008/0192462 A1 | 8/2008 | Steedly et al. |
| 2008/0192493 A1 | 8/2008 | Villard |
| 2008/0197376 A1 | 8/2008 | Bert et al. |
| 2008/0211416 A1 | 9/2008 | Negley et al. |
| 2008/0231201 A1 | 9/2008 | Higley et al. |
| 2008/0259589 A1 | 10/2008 | Van De Ven et al. |
| 2008/0278928 A1 | 11/2008 | Van de Ven et al. |
| 2008/0278940 A1 | 11/2008 | Van de Ven et al. |
| 2008/0278950 A1 | 11/2008 | Pickard et al. |
| 2008/0278952 A1 | 11/2008 | Trott et al. |
| 2008/0304260 A1 | 12/2008 | Van De Ven et al. |
| 2008/0304261 A1 | 12/2008 | Van De Ven et al. |
| 2008/0304269 A1 | 12/2008 | Pickard et al. |
| 2008/0309255 A1 | 12/2008 | Myers |
| 2008/0310154 A1 | 12/2008 | Van De Ven et al. |
| 2009/0002986 A1 | 1/2009 | Medendorp et al. |
| 2009/0296384 A1 | 12/2009 | Van de Ven |
| 2010/0140585 A1 | 6/2010 | Bawendi et al. |
| 2010/0141118 A1 | 6/2010 | Bawendi et al. |
| 2010/0176715 A1 | 7/2010 | Bawendi et al. |
| 2011/0279015 A1 | 11/2011 | Negley et al. |
| 2012/0012877 A1 | 1/2012 | Bawendi et al. |
| 2012/0280611 A1 | 11/2012 | Bawendi et al. |
| 2013/0207073 A1 | 8/2013 | Bawendi et al. |
| 2014/0084323 A1 | 3/2014 | Shimizu et al. |

FOREIGN PATENT DOCUMENTS

| | | |
|---|---|---|
| DE | 10-335077 | 3/2005 |
| EP | 0 838 866 | 4/1998 |
| EP | 936 682 | 8/1999 |
| EP | 0 971 421 | 1/2000 |
| EP | 1 024 399 | 8/2000 |
| EP | 1 081 771 | 3/2001 |
| EP | 1 160 883 | 12/2001 |
| EP | 1 193 772 | 4/2002 |
| EP | 1 016 062 | 8/2002 |
| EP | 1 367 655 | 12/2003 |
| EP | 1 380 876 | 1/2004 |
| EP | 1 416 219 | 5/2004 |
| EP | 1 462 711 | 12/2004 |
| EP | 1 557 604 | 7/2005 |
| EP | 1 566 848 | 8/2005 |
| EP | 1 571 715 | 9/2005 |
| EP | 1 760 795 | 1/2006 |
| EP | 1 662 583 | 5/2006 |
| EP | 1 837 386 | 9/2007 |
| EP | 2 325 897 | 5/2011 |
| JP | 04-159519 | 6/1992 |
| JP | 09-146089 | 6/1997 |
| JP | 10-163531 | 6/1998 |
| JP | 10-163535 | 6/1998 |
| JP | 10-242513 | 9/1998 |
| JP | 11-199781 | 7/1999 |
| JP | 2000-022222 | 1/2000 |
| JP | 2000-183408 | 6/2000 |
| JP | 2000-261039 | 9/2000 |

(56) References Cited

FOREIGN PATENT DOCUMENTS

| | | |
|---|---|---|
| JP | 2001-111114 | 4/2001 |
| JP | 2001-156331 | 6/2001 |
| JP | 2001-307506 | 11/2001 |
| JP | 2002-057376 | 2/2002 |
| JP | 2002/510866 | 4/2002 |
| JP | 2002-150821 | 5/2002 |
| JP | 2003-515956 | 5/2003 |
| JP | 2003-179259 | 6/2003 |
| JP | 2003-529889 | 10/2003 |
| JP | 2003-317979 | 11/2003 |
| JP | 2003-347588 | 12/2003 |
| JP | 2004-080046 | 3/2004 |
| JP | 2004-103443 | 4/2004 |
| JP | 2004/152993 | 5/2004 |
| JP | 2004-152993 | 5/2004 |
| JP | 2004-253309 | 9/2004 |
| JP | 2004-311791 | 11/2004 |
| JP | 2004-356116 | 12/2004 |
| JP | 2004-363055 | 12/2004 |
| JP | 2005-005482 | 1/2005 |
| JP | 2005-101296 | 4/2005 |
| JP | 2005-513724 | 5/2005 |
| JP | 2005-142311 | 6/2005 |
| JP | 2005-228979 | 8/2005 |
| JP | 2006-164879 | 6/2006 |
| JP | 2006-282994 | 10/2006 |
| JP | 2006-310856 | 11/2006 |
| JP | 2007-109617 | 4/2007 |
| JP | 2007-122950 | 5/2007 |
| JP | 2007-141737 | 6/2007 |
| JP | 2009-534794 | 9/2009 |
| KR | 10-2004-0029313 | 4/2004 |
| KR | 10-0425749 | 4/2004 |
| TW | 200511671 | 7/1993 |
| TW | 546854 | 8/2003 |
| TW | 556365 | 10/2003 |
| TW | 572994 | 1/2004 |
| TW | 595012 | 6/2004 |
| TW | 200523660 | 7/2005 |
| TW | I244772 | 12/2005 |
| TW | 200612582 | 4/2006 |
| TW | 200641169 | 3/2010 |
| TW | 200418334 | 11/2010 |
| TW | I365550 | 6/2012 |
| WO | 98/43014 | 10/1998 |
| WO | 99/66483 | 12/1999 |
| WO | 00/19546 | 4/2000 |
| WO | 00/34709 | 6/2000 |
| WO | 01/41215 | 6/2001 |
| WO | 01/43113 | 6/2001 |
| WO | 01/69692 | 9/2001 |
| WO | 03/019072 | 3/2003 |
| WO | 03/053111 | 6/2003 |
| WO | 03/056876 | 7/2003 |
| WO | 03/091771 | 11/2003 |
| WO | 2004/068909 | 8/2004 |
| WO | 2005/004202 | 1/2005 |
| WO | 2005/013365 | 2/2005 |
| WO | 2005013365 | 2/2005 |
| WO | 2005/013365 | 10/2005 |
| WO | 2005/124877 | 12/2005 |
| WO | 2005124877 | 12/2005 |
| WO | WO 2005/124877 | 12/2005 |
| WO | WO 2006013513 A1 * | 2/2006 |
| WO | 2006/028312 | 3/2006 |
| WO | 2006/033031 | 3/2006 |
| WO | 2006/062047 | 6/2006 |
| WO | 2006/077740 | 7/2006 |
| WO | 2007/061758 | 5/2007 |
| WO | 2007/123940 | 11/2007 |

OTHER PUBLICATIONS

U.S. Appl. No. 11/614,180, filed Dec. 21, 2006.
U.S. Appl. No. 11/624,811, filed Jan. 19, 2007.
U.S. Appl. No. 11/626,483, filed Jan. 24, 2007.
U.S. Appl. No. 11/948,021, filed Nov. 30, 2007.
U.S. Appl. No. 11/613,714, filed Dec. 20, 2006.
U.S. Appl. No. 11/736,799, filed Apr. 18, 2007.
U.S. Appl. No. 11/755,153, filed May 30, 2007.
U.S. Appl. No. 11/936,163, filed Nov. 7, 2007.
U.S. Appl. No. 12/117,122, filed May 8, 2008.
U.S. Appl. No. 12/117,131, filed May 8, 2008.
U.S. Appl. No. 12/117,136, filed May 8, 2008.
U.S. Appl. No. 11/843,243, filed Aug. 22, 2007.
U.S. Appl. No. 11/947,323, filed Nov. 29, 2007.
U.S. Appl. No. 11/951,626, filed Dec. 6, 2007.
U.S. Appl. No. 12/035,604, filed Feb. 22, 2008.
U.S. Appl. No. 12/117,148, filed May 8, 2008.
U.S. Appl. No. 12/117,271, filed May 8, 2608.
U.S. Appl. No. 12/057,748, filed Mar. 28, 2008.
U.S. Appl. No. 11/743,324, filed May 2, 2007.
U.S. Appl. No. 11/032,363, filed Jan. 10, 2005.
U.S. Appl. No. 61/075,513, filed Jun. 25, 2008.
U.S. Appl. No. 61/037,365, filed Mar. 18, 2008.
U.S. Appl. No. 60/990,439, filed Nov. 27, 2007.
Van de Ven et al., "Warm White Illumination with High CRI and High Efficacy by Combining 455 nm Excited Yellowish Phosphor LEDs and Red AlInGaP LEDs", First International Conference on White LEDs and Solid State Lighting.
Cree® XLamp® 7090 XR-E Series LED Binning and Labeling.
U.S. Appl. No. 12/248,220, filed Oct. 9, 2008.
U.S. Appl. No. 12/277,745, filed Nov. 25, 2008.
U.S. Appl. No. 13/042,663, filed Mar. 8, 2011, Van de Ven et al.
Korean Preliminary Rejection dated Nov. 30, 2012 (and translation provided by foreign counsel).
U.S. Appl. No. 13/804,035, filed Mar. 14, 2013, Pickard et al.
White Light LED, Part Nos. NSPW300BS and NSPW312BS, High Brightness LEDs, Nov. 12, 1999, Publisher: Nichia Corporation.
Chhajed, S., *Influence of junction temperature on chromaticity and color-rendering properties of trichromatic white-light sources . . .* , Journal of Applied Physics, 2005, vol. 97pp. 1-8.
Color Kinetics Inc., Color Kinetics Support : White Papers & Presentations; available at http://www.colorkineties.com/support/whitepapers/:, Solid State Lighting White Papers & Presentations, Feb. 22, 2006, pp. 1-4.
Color Kinetics Inc., *Color Quality of Intelligent Solid-State Light Systems*, Color Quality of Solid-State Light Sources, Mar. 2005, pp. 1-3.
Compound Semiconductors Online, "LED Lighting Fixtures, Inc. Sets World Record at 80 Lumens per Watt for Warm White", Compound Semiconductors Online, May 30, 2006, pp. 1.
Cree, Inc., "Cree® Xlamp® 7090 XR-E Series LED Binning and Labeling," Application Note: CLD-AP08.000, 7pp (2006).
CSA International, "Test Data Report," Project No. 1786317, Report No. 1786317-1 (Apr. 2006).
DOE SSL CALiPer Report, "Product Test Reference: CALiPER 07-31 Downlight Lamp".
DOE SSL CALiPer Report, "Product Test Reference: Caliper 07-47 Downlight Lamp".
Krames et al., *Lumileds Lighting, Light from Silicon Valley*, Progress and Future Direction of LED Technology, SSL Workshop, Nov. 13, 2003, Publisher: Limileds Lighting Inc., pp. 1-21.
Narendran et al., "Solid State lighting: failure analysis of white LEDs," Journal of Cystal Growth, vol. 268, Issues 1-4, Aug. 2004, Abstract.
Narendran et al., *Color Rendering Properties of LED Light Sources*, 2002, pp. 1-8.
Nichia, White Light LED, Part Nos. NSPW300BS and NSPW312BS, High Brightness LEDs, Nov. 12, 1999, Publisher: Nichia Corporation.
Press Release from LED Lighting Fixtures dated Apr. 24, 2006 entitled "LED Lighting Fixtures, Inc. achieves unprecedented gain in light output from new luminaire".
Press Release from LED Lighting Fixtures dated Feb. 16, 2006 entitled "LED Lighting Fixtures, Inc. Announces Record Performance".

(56) References Cited

OTHER PUBLICATIONS

Press Release from LED Lighting Fixtures dated Feb. 7, 2007 entitled "LED Lighting Fixtures Announces its first LED-based Recessed Down Light".
Press Release from LED Lighting Fixtures dated Jan. 26, 2006 entitled "LED Lighting Fixtures Creates 750 Lumen Recessed Light and Uses Only 16 Watts of Power".
Press Release from LED Lighting Fixtures dated May 30, 2006 entitled "LED Lighting Fixtures, Inc. Sets World Record at 80 Lumens per Watt for Warm White Fixture".
Press Release from LED Lighting Fixtures dated Nov. 28, 2007 entitled "New Lamp from LED Lighting Fixtures Shatter World Record for Energy Efficiency".
Shimizu, "Development of High-Efficiency LED Downlight", First International Conference on White LEDs and Solid State Lighting, Nov. 30, 2007.
U.S. Department of Energy, "DOE Solid-State Lighting CALiPER Program, Summary of Results: Round 3 of Product Testing," Oct. 2007.
U.S. Department of Energy, "DOE Solid-State Lighting CALiPER Program, Summary of Results: Round 4 of Product Testing," Jan. 2008.
U.S. Department of Energy, "DOE Solid-State Lighting CALiPER Program, Summary of Results: Round 5 of Product Testing," May 2008.
Van De Ven et al., "Warm White Illumination with High CRI and High Efficacy by Combining 455 nm Excited Yellowish Phosphor LEDs and Red AlInGaP LEDs," First International Conference on White LEDs and Solid State Lighting, Nov. 30, 2007.
Color Kinetics Inc., Color Kinetics Support : White Papers & Presentations; available at http://www.colorkinetics.com/support/whitepapers/:, Solid State Lighting White Papers & Presentations, Feb. 22, 2006, pp. 1-4.
Optoled Lighting Inc., *OptoLED Product Information*, 2009, Publisher: OptoLED GmBH website: accessed at http://222.optoled.de/englisch/products/led.html.
Permlight Inc., *Enbryten LED Product Information*, Feb. 2005, Publisher: Permlight Inc. website; accessed at http://www.webarchive.org displaying that www.permlight.com/products/LEDfixtures.asp was publicly available Jan. 2004.
Office Action (and translation provided by foreign counsel) from a corresponding Korean patent application bearing a mailing date of Dec. 9, 2013 (7 pages).
Japanese Office Action dated Sep. 24, 2013 (and English translation provided by foreign counsel), pp. 1-8.
Korean Office Action (and translation provided by foreign counsel) from a corresponding Korean patent application (KR1020087028013) bearing a mailing date of Jul. 31, 2014, 7 pages.
Korean Office Action (and translation provided by foreign counsel) from a corresponding Korean patent application (KR1020137002666) bearing a mailing date of Jul. 31, 2014, 6 pages.
Tanabe, Setsuhisa et al: "YAG glass-ceramic phosphor for white LED (II): Luminescence characteristics", Proceedings of SPIE, S P I E—International Society for Optical Engineering, US, vol. 5941, Jan. 1, 2005, pp. 1-6, XP002459950,ISSN: 0277-786X, D0I: 10.1117/12.614681, 6 pages.

Joung, Kyu Park et al: "Application of $Ba^{2+}.Mg^{2+}$Co—doped $Sr_2SiO_4$: Eu Yellow Phosphor for White-Light-Emitting Diodes", Journal of the Electrochemical Society, vol. 152, No. 8, Jan. 1, 2005, p. H121, XP055126869, ISSN: 0013-4651, D01:10.1149/1.1939187, 3 pages.
Katayama, K et al: "ZnSe—based white LEDs", Journal of Crystal Growth, El Sevier, Amsterdam, NL, vol. 214-215, Jun. 1, 2000, pp. 1064-1070, XP004201171, ISSN: 0022-0248, D01: 10.1016/50022-0248(00)00275-X, 7 pages.
European Office Action from a corresponding European patent application bearing a mailing date of Jul. 9, 2014, 5 pages.
EP Summons from a EP patent application bearing a mailing date of Dec. 7, 2010, 5 pages.
EP Office Action from a EP patent application hearing a mailing date of Jul. 12, 2012, 6 pages.
JP Office Action (and translation provided by foreign counsel) from a JP patent application bearing a mailing date of Aug. 22, 2012, 5 pages.
KR Office Action (and translation provided by foreign counsel) from a KR patent application bearing a mailing date of Dec. 6, 2013, 7 pages.
KR Office Action (and translation provided by foreign counsel) from a KR patent application bearing a mailing date of Oct. 31, 2014, 7 pages.
TW Office Action (and translation provided by foreign counsel) from a TW patent application bearing a mailing date of Jan. 24, 2014, 25 pages.
EP Office Action from a EP patent application bearing a mailing date of Feb. 25, 2010, 3 pages.
EP Office Action from a EP patent application bearing a mailing date of Apr. 5, 2012, 11 pages.
Deurenberg et al., Achieving color point stability in RGB multi-chip LED modules using various color control loops, Sep. 7, 2005, 12 pages.
JP Office Action (and translation provided by foreign counsel) from a JP patent application bearing a mailing date of Jan. 27, 2012, 5 pages.
JP Office Action (and translation provided by foreign counsel) from a JP patent application bearing a mailing date of Sep. 27, 2012, 12 pages.
TW Office Action (and translation provided by foreign counsel) from a TW patent application bearing a mailing date of Mar. 13, 2014, 28 pages.
International Search Report and Written Opinion of the International Searching Authority from an international patent application bearing a mailing date of Jul. 21, 2008, 15 pages.
JP Office Action (and translation provided by foreign counsel) from a JP patent application bearing a mailing date of Jul. 18, 2013, 10 pages.
Gerd O Mueller et al: *Illumination-grade white LEDs*, Proceedings of SPIE, vol. 4776, Nov. 26, 2002, XP055126871, ISSN: 0277-786X, DOI: 10.1117/12.457123, 9 pages.
European Office Action from a corresponding European patent application bearing a mailing date of Mar. 9, 2015, 6 pages.

\* cited by examiner

LIGHTING DEVICE AND LIGHTING METHOD

CROSS-REFERENCE TO RELATED APPLICATIONS

This application is a continuation of U.S. patent application Ser. No. 11/736,761, (now U.S. Patent Publication No. 2007/0278934), filed Apr. 18, 2007, the entirety of which is incorporated herein by reference as if set forth in its entirety.

This application claims the benefit of U.S. Provisional Patent Application No. 60/792,859, filed on Apr. 18, 2006, entitled "LIGHTING DEVICE AND LIGHTING METHOD" (inventors: Gerald H. Negley and Antony Paul van de Ven), the entirety of which is hereby incorporated by reference.

This application claims the benefit of U.S. Provisional Patent Application No. 60/793,524, filed on Apr. 20, 2006, entitled "LIGHTING DEVICE AND LIGHTING METHOD" (inventors: Gerald H. Negley and Antony Paul van de Ven), the entirety of which is hereby incorporated by reference.

This application claims the benefit of U.S. Provisional Patent Application No. 60/868,134, filed on Dec. 1, 2006, entitled "LIGHTING DEVICE AND LIGHTING METHOD" (inventors: Gerald H. Negley and Antony Paul van de Ven), the entirety of which is hereby incorporated by reference.

The entirety of U.S. patent application Ser. No. 11/566,440, filed on Dec. 4, 2006, entitled "LIGHTING DEVICE AND LIGHTING METHOD" (inventors: Antony Paul van de Ven and Gerald H. Negley) (now U.S. Pat. No. 7,213,940) is hereby incorporated by reference.

FIELD OF THE INVENTION

The present invention relates to a lighting device, in particular, a device which includes one or more solid state light emitters and one or more luminescent materials (e.g., one or more phosphors). The present invention is also directed to lighting methods.

BACKGROUND OF THE INVENTION

A large proportion (some estimates are as high as twenty-five percent) of the electricity generated in the United States each year goes to lighting. Accordingly, there is an ongoing need to provide lighting which is more energy-efficient. It is well-known that incandescent light bulbs are very energy-inefficient light sources—about ninety percent of the electricity they consume is released as heat rather than light. Fluorescent light bulbs are more efficient than incandescent light bulbs (by a factor of about 10) but are still less efficient as compared to solid state light emitters, such as light emitting diodes.

In addition, as compared to the normal lifetimes of solid state light emitters, incandescent light bulbs have relatively short lifetimes, i.e., typically about 750-1000 hours. In comparison, light emitting diodes, for example, typically have lifetimes between 50,000 and 70,000 hours. Fluorescent bulbs have longer lifetimes (e.g., 10,000-20,000 hours) than incandescent lights, but provide less favorable color reproduction.

Color reproduction is typically measured using the Color Rendering Index (CRI). CRI Ra is a relative measurement of how the color rendition of an illumination system compares to that of a reference illuminator (light source). For color temperatures below 5,000 K, a blackbody radiator is used, and for color temperatures above 5,000 K, a series of spectra defined by the CIE (Commission International de l'Eclairage) are used. CRI Ra is the average of the differences in the shift in surface color of an object when lit by a particular lamp, relative to the surface color of the object when illuminated by the reference light source. The CRI Ra equals 100 if the color coordinates of a set of test colors being illuminated by the illumination system are the same as the coordinates of the same test colors being irradiated by the reference radiator. Daylight has a high CRI (Ra being approximately 100), with incandescent bulbs also being relatively close (Ra greater than 95), and fluorescent lighting being less accurate (typical Ra of 70-80). Certain types of specialized lighting have very low CRI (e.g., mercury vapor or sodium lamps have Ra as low as about 40 or even lower). Sodium lights are used, e.g., to light highways—driver response time, however, significantly decreases with lower CRI values (for any given brightness, legibility decreases with lower CRI).

Another issue faced by conventional light fixtures is the need to periodically replace the lighting devices (e.g., light bulbs, etc.). Such issues are particularly pronounced where access is difficult (e.g., vaulted ceilings, bridges, high buildings, traffic tunnels) and/or where change-out costs are extremely high. The typical lifetime of conventional fixtures is about 20 years, corresponding to a light-producing device usage of at least about 44,000 hours (based on usage of 6 hours per day for 20 years). Light-producing device lifetime is typically much shorter, thus creating the need for periodic change-outs.

Accordingly, for these and other reasons, efforts have been ongoing to develop ways by which light emitting diodes can be used in place of incandescent lights, fluorescent lights and other light-generating devices in a wide variety of applications. In addition, where light emitting diodes are already being used, efforts are ongoing to provide light emitting diodes which are improved, e.g., with respect to energy efficiency, color rendering index (CRI Ra), contrast, efficacy (1 m/W), and/or duration of service.

Light emitting diodes are well-known semiconductor devices that convert electrical current into light. A wide variety of light emitting diodes are used in increasingly diverse fields for an ever-expanding range of purposes.

More specifically, light emitting diodes are semiconducting devices that emit light (ultraviolet, visible, or infrared) when a potential difference is applied across a p-n junction structure. There are a number of well-known ways to make light emitting diodes and many associated structures, and the present invention can employ any such devices. By way of example, Chapters 12-14 of Sze, Physics of Semiconductor Devices, (2d Ed. 1981) and Chapter 7 of Sze, Modern Semiconductor Device Physics (1998) describe a variety of photonic devices, including light emitting diodes.

The commonly recognized and commercially available light emitting diode ("LED") that is sold (for example) in electronics stores typically represents a "packaged" device made up of a number of parts. These packaged devices typically include a semiconductor based light emitting diode such as (but not limited to) those described in U.S. Pat. Nos. 4,918,487; 5,631,190; and 5,912,477; various wire connections, and a package that encapsulates the light emitting diode.

As is well-known, a light emitting diode produces light by exciting electrons across the band gap between a conduction band and a valence band of a semiconductor active (light-emitting) layer. The electron transition generates light at a wavelength that depends on the band gap. Thus, the color of the light (wavelength) emitted by a light emitting diode depends on the semiconductor materials of the active layers of the light emitting diode.

Although the development of light emitting diodes has in many ways revolutionized the lighting industry, some of the characteristics of light emitting diodes have presented challenges, some of which have not yet been fully met. For example, the emission spectrum of any particular light emitting diode is typically concentrated around a single wavelength (as dictated by the light emitting diode's composition and structure), which is desirable for some applications, but not desirable for others, (e.g., for providing lighting, such an emission spectrum provides a very low CRI).

Because light that is perceived as white is necessarily a blend of light of two or more colors (or wavelengths), no single light emitting diode junction has been developed that can produce white light. "White" light emitting lamps have been produced which have a light emitting diode pixel formed of respective red, green and blue light emitting diodes. Other "white" light emitting diodes have been produced which include (1) a light emitting diode which generates blue light and (2) a luminescent material (e.g., a phosphor) that emits yellow light in response to excitation by light emitted by the light emitting diode, whereby the blue light and the yellow light, when mixed, produce light that is perceived as white light.

In addition, the blending of primary colors to produce combinations of non-primary colors is generally well understood in this and other arts. In general, the 1931 CIE Chromaticity Diagram (an international standard for primary colors established in 1931), and the 1976 CIE Chromaticity Diagram (similar to the 1931 Diagram but modified such that similar distances on the Diagram represent similar perceived differences in color) provide useful reference for defining colors as weighted sums of primary colors.

Light emitting diodes can thus be used individually or in any combinations, optionally together with one or more luminescent material (e.g., phosphors or scintillators) and/or filters, to generate light of any desired perceived color (including white). Accordingly, the areas in which efforts are being made to replace existing light sources with light emitting diode light sources, e.g., to improve energy efficiency, color rendering index (CRI), efficacy (1 m/W), and/or duration of service, are not limited to any particular color or color blends of light.

A wide variety of luminescent materials (also known as lumiphors or luminophoric media, e.g., as disclosed in U.S. Pat. No. 6,600,175, the entirety of which is hereby incorporated by reference) are well-known and available to persons of skill in the art. For example, a phosphor is a luminescent material that emits a responsive radiation (e.g., visible light) when excited by a source of exciting radiation. In many instances, the responsive radiation has a wavelength which is different from the wavelength of the exciting radiation. Other examples of luminescent materials include scintillators, day glow tapes and inks which glow in the visible spectrum upon illumination with ultraviolet light.

Luminescent materials can be categorized as being down-converting, i.e., a material which converts photons to a lower energy level (longer wavelength) or up-converting, i.e., a material which converts photons to a higher energy level (shorter wavelength).

Inclusion of luminescent materials in LED devices has been accomplished by adding the luminescent materials to a clear or translucent encapsulant material (e.g., epoxy-based, silicone-based or glass-based material) as discussed above, for example by a blending or coating process.

For example, U.S. Pat. No. 6,963,166 (Yano '166) discloses that a conventional light emitting diode lamp includes a light emitting diode chip, a bullet-shaped transparent housing to cover the light emitting diode chip, leads to supply current to the light emitting diode chip, and a cup reflector for reflecting the emission of the light emitting diode chip in a uniform direction, in which the light emitting diode chip is encapsulated with a first resin portion, which is further encapsulated with a second resin portion. According to Yano '166, the first resin portion is obtained by filling the cup reflector with a resin material and curing it after the light emitting diode chip has been mounted onto the bottom of the cup reflector and then has had its cathode and anode electrodes electrically connected to the leads by way of wires. According to Yano '166, a phosphor is dispersed in the first resin portion so as to be excited with the light A that has been emitted from the light emitting diode chip, the excited phosphor produces fluorescence ("light B") that has a longer wavelength than the light A, a portion of the light A is transmitted through the first resin portion including the phosphor, and as a result, light C, as a mixture of the light A and light B, is used as illumination.

As noted above, "white LED lights" (i.e., lights which are perceived as being white or near-white) have been investigated as potential replacements for white incandescent lamps. A representative example of a white LED lamp includes a package of a blue light emitting diode chip, made of indium gallium nitride (InGaN) or gallium nitride (GaN), coated with a phosphor such as YAG. In such an LED lamp, the blue light emitting diode chip produces an emission with a wavelength of about 450 nm, and the phosphor produces yellow fluorescence with a peak wavelength of about 550 nm on receiving that emission. For instance, in some designs, white light emitting diodes are fabricated by forming a ceramic phosphor layer on the output surface of a blue light-emitting semiconductor light emitting diode. Part of the blue ray emitted from the light emitting diode chip passes through the phosphor, while part of the blue ray emitted from the light emitting diode chip is absorbed by the phosphor, which becomes excited and emits a yellow ray. The part of the blue light emitted by the light emitting diode which is transmitted through the phosphor is mixed with the yellow light emitted by the phosphor. The viewer perceives the mixture of blue and yellow light as white light.

As also noted above, in another type of LED lamp, a light emitting diode chip that emits an ultraviolet ray is combined with phosphor materials that produce red (R), green (G) and blue (B) light rays. In such an "RGB LED lamp", the ultraviolet ray that has been radiated from the light emitting diode chip excites the phosphor, causing the phosphor to emit red, green and blue light rays which, when mixed, are perceived by the human eye as white light. Consequently, white light can also be obtained as a mixture of these light rays.

Designs have been provided in which existing LED component packages and other electronics are assembled into a fixture. In such designs, a packaged LED is mounted to a circuit board or a heat sink directly, the circuit board is mounted to a heat sink, and the heat sink is mounted to the fixture housing along with required drive electronics. In many cases, additional optics (secondary to the package parts) are also necessary.

In substituting light emitting diodes for other light sources, e.g., incandescent light bulbs, packaged LEDs have been used with conventional light fixtures, for example, fixtures which include a hollow lens and a base plate attached to the lens, the base plate having a conventional socket housing with one or more contacts which are electrically coupled to a power source. For example, LED light bulbs have been constructed which comprise an electrical circuit board, a plurality of packaged LEDs mounted to the circuit board, and a connection post attached to the circuit board and adapted to be connected to the socket housing of the light fixture, whereby the plurality of LEDs can be illuminated by the power source.

There is an ongoing need for ways to use solid state light emitters, e.g., light emitting diodes, to provide white light in a wider variety of applications, with greater energy efficiency, with improved color rendering index (CRI), with improved efficacy (1 m/W), low cost and/or with longer duration of service.

BRIEF SUMMARY OF THE INVENTION

There exist "white" LED light sources which are relatively efficient but which have poor color rendering, typically having CRI Ra values of less than 75, and which are particularity deficient in the rendering of red colors and also to a significant extent deficient in green. This means that many things, including the typical human complexion, food items, labeling, painting, posters, signs, apparel, home decoration, plants, flowers, automobiles, etc. exhibit odd or wrong color as compared to being illuminated with an incandescent light or natural daylight. Typically, such white LEDs have a color temperature of approximately 5,000 K, which is generally not visually comfortable for general illumination, which however may be desirable for the illumination of commercial produce or advertising and printed materials.

Some so-called "warm white" LEDs have a more acceptable color temperature (typically 2700 to 3500 K) for indoor use, and, in some special cases, good CRI (in the case of a yellow and red phosphor mix, as high as Ra=95), but their efficiency is generally significantly less than that of the standard "cool white" LEDs.

Colored objects illuminated by RGB LED lamps sometimes do not appear in their true colors. For example, an object that reflects only yellow light, and thus that appears to be yellow when illuminated with white light, may appear desaturated and grayish when illuminated with light having an apparent yellow color, produced by the red and green LEDs of an RGB LED fixture. Such lamps, therefore, are considered not to provide excellent color rendition, particularly when illuminating various settings such as in general illumination and particularly with regard to natural scenes. In addition, currently available green LEDs are relatively inefficient, and thus limit the efficiency of such lamps.

Employing LEDs having a wide variety of hues would similarly necessitate use of LEDs having a variety of efficiencies, including some with low efficiency, thereby reducing the efficiency of such systems, and dramatically increase the complexity and cost of the circuitry to control the many different types of LEDs and maintain the color balance of the light.

There is therefore a need for a high efficiency white light source that combines the efficiency and long life of white LEDs (i.e., which avoids the use of relatively inefficient light sources) with an acceptable color temperature and good color rendering index, a wide gamut and simple control circuitry.

In accordance with the present invention, it has unexpectedly been found that surprisingly high CRI can be obtained by combining (1) light emitted from one or more light emitting diodes which emit light having a peak wavelength in the range of from 430 nm to 480 nm, (2) light emitted from one more lumiphors which emit light having a dominant wavelength in the range of from 555 to 585 and (3) light emitted from one or more light emitting diodes which emit light having a having a dominant wavelength in the range of from 600 nm to 630 nm.

Particularly high CRI can be obtained where, in addition, the light emitting diodes and the lumiphors are selected such that if each of the first group of light emitting diodes is illuminated and each of the first group of lumiphors is excited, a mixture of light emitted from the first group of light emitting diodes and the first group of lumiphors would, in the absence of any additional light, have a first group mixed illumination having x, y color coordinates which are within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38.

In one aspect of the present invention, the light emitting diodes and the lumiphors are selected such that a mixture of light emitted from the first group of light emitting diodes, from the first group of lumiphors and from the second group of light emitting diodes would produce a first group-second group mixed illumination having x, y coordinates on a 1931 CIE, Chromaticity Diagram which define a point which is within 10 MacAdam ellipses (or within 20 MacAdam ellipses, or within 40 MacAdam ellipses) of at least one point within the range of from about 2200K to about 4500K on the blackbody locus on a 1931 CIE Chromaticity Diagram.

In addition, it has unexpectedly been found that surprisingly high CRI can be obtained by combining light as described above, particularly where the light (2) referred to above (i.e., the light emitted from one or more lumiphors which emit light having a dominant wavelength in the range of from 555 to 585) is emitted from a broad spectrum light source, e.g., a yellow lumiphor.

Accordingly, in a first aspect of the present invention, there is provided a lighting device comprising:
  a first group of light emitting diodes;
  a first group of lumiphors; and
  a second group of light emitting diodes;
  wherein:
    each of the first group of light emitting diodes, if illuminated, would emit light having a peak wavelength in the range of from 430 nm to 480 nm;
    each of the first group of lumiphors, if excited, would emit light having a dominant wavelength in the range of from about 555 nm to about 585 nm; and
    each of the second group of light emitting diodes, if illuminated, would emit light having a dominant wavelength in the range of from 600 nm to 630 nm.

In some embodiments according to this aspect of the present invention (and other aspects of the present invention), the device can include additional 430 nm to 480 nm light emitting diodes (i.e., light emitting diodes which, if illuminated, would emit light having a peak wavelength in the range of from about 430 nm to about 480 nm) which are not within the first group of light emitting diodes, and/or the device can include additional 555 nm to 585 nm lumiphors (i.e., lumiphors which, if excited, would emit light having a dominant wavelength in the range of from about 555 nm to about 585 nm) which are not within the first group of lumiphors, and/or the device can include additional 600 nm to 630 nm light emitting diodes (i.e., light emitting diodes which, if illuminated, would emit light having a dominant wavelength in the range of from about 600 nm to about 630 nm) which are not within the second group of light emitting diodes.

In some embodiments according to this aspect of the present invention (and other aspects of the present invention), the first group of light emitting diodes consists of all of the 430 nm to 480 nm light emitting diodes in the device, the first group of lumiphors consists of all of the 555 nm to 585 nm lumiphors in the device, and the second group of light emitting diodes consists of all of the 600 nm to 630 nm light emitting diodes in the device.

According to a second aspect of the present invention, there is provided a lighting device comprising:

a first group of light emitting diodes;
a first group of lumiphors; and
a second group of light emitting diodes;
wherein:
each of the first group of light emitting diodes, if illuminated, would emit light having a peak wavelength in the range of from 430 nm to 480 nm;
each of the first group of lumiphors, if excited, would emit light having a dominant wavelength in the range of from about 555 nm to about 585 nm;
each of the second group of light emitting diodes, if illuminated, would emit light having a dominant wavelength in the range of from 600 nm to 630 nm; and
if each of the first group of light emitting diodes is illuminated (e.g., by inserting into a standard 120 AC receptacle a power plug which is electrically connected to a power line which is directly or switchably electrically connected to the lighting device) and each of the first group of lumiphors is excited, a mixture of light emitted from the first group of light emitting diodes and the first group of lumiphors would, in the absence of any additional light, have a first group mixed illumination having x, y color coordinates which are within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38.

In some embodiments according to this aspect of the present invention, the device can include additional 430 nm to 480 nm light emitting diodes which are not within the first group of light emitting diodes, and/or the device can include additional 555 nm to 585 nm lumiphors which are not within the first group of lumiphors, and/or the device can include additional 600 nm to 630 nm light emitting diodes which are not within the second group of light emitting diodes, including wherein if any of such additional 430 nm to 480 nm light emitting diodes and/or 555 nm to 585 nm lumiphors were illuminated or excited in addition to all of the light emitting diodes in the first group of light emitting diodes and all of the lumiphors in the first group of lumiphors, there would be produced combined light having x, y color coordinates which are not within the area on a 1931 CIE Chromaticity Diagram enclosed by the first, second, third, fourth and fifth line segments defined above.

In some embodiments according to this aspect of the present invention, the first group of light emitting diodes consists of all of the 430 nm to 480 nm light emitting diodes in the device, the first group of lumiphors consists of all of the 555 nm to 585 nm lumiphors in the device, and the second group of light emitting diodes consists of all of the 600 nm to 630 nm light emitting diodes in the device.

According to a third aspect of the present invention, there is provided a lighting device comprising:

a first group of light emitting diodes;
a first group of lumiphors; and
a second group of light emitting diodes;
wherein:
each of the first group of light emitting diodes, if illuminated, would emit light having a peak wavelength in the range of from 430 nm to 480 nm;
each of the first group of lumiphors, if excited, would emit light having a dominant wavelength in the range of from about 555 nm to about 585 nm;
each of the second group of light emitting diodes, if illuminated, would emit light having a dominant wavelength in the range of from 600 nm to 630 nm; and
if each of the first group of light emitting diodes is illuminated, a mixture of light emitted from the first group of light emitting diodes and the first group of lumiphors would, in the absence of any additional light, have a first group mixed illumination having x, y color coordinates which are within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38.

In some embodiments according to this aspect of the invention, at least some of the lumiphors in the first group of lumiphors are excited by light emitted from the first group of light emitting diodes.

In some embodiments according to this aspect of the present invention, the lighting device can include additional 555 nm to 585 nm lumiphors which would not be excited by light emitted from any of the light emitting diodes in the first group of light emitting diodes, even when all of the light emitting diodes in the first group of light emitting diodes are emitting light.

In some embodiments according to this aspect of the present invention, the lighting device can include additional 555 nm to 585 nm lumiphors (1) which would not be excited by light emitted from any of the light emitting diodes in the first group of light emitting diodes and (2) which, if such additional 555 nm to 585 nm lumiphors were excited and all of the 430 to 480 nm light emitting diodes in the first group of light emitting diodes were illuminated, the combined light would have x, y color coordinates which are not within the area on a 1931 CIE Chromaticity Diagram enclosed by the first, second, third, fourth and fifth line segments defined above.

According to a fourth aspect of the present invention, there is provided a lighting device comprising:

a first group of light emitting diodes;
a first group of lumiphors; and
a second group of light emitting diodes;

at least one power line directly or switchably electrically connected to the lighting device, wherein:

each of the first group of light emitting diodes, if illuminated, would emit light having a peak wavelength in the range of from 430 nm to 480 nm;

each of the first group of lumiphors, if excited, would emit light having a dominant wavelength in the range of from about 555 nm to about 585 nm;

each of the second group of light emitting diodes, if illuminated, would emit light having a dominant wavelength in the range of from 600 nm to 630 nm; and if power is supplied to at least one of the at least one power line (e.g., by inserting into a standard 120 AC receptacle a power plug which is electrically connected to the power line and, if necessary, closing one or more switch in the power line), a mixture of light would be emitted from the first group of light emitting diodes and the first group of lumiphors which, in the absence of any additional light, would have a first group mixed illumination having x, y color coordinates which are within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38.

In some embodiments according to this aspect of the present invention, the lighting device can include one or more additional 430 nm to 480 nm light emitting diodes which are not connected to the at least one power line (but which might be connected to some other power line), and in which, if such additional 430 nm to 480 nm light emitting diode(s) were illuminated in addition to all of the 430 nm to 480 nm light emitting diodes connected to the at least one power line, the combined light emitted from all of the 430 nm to 480 nm light emitting diodes in the device and the 555 nm to 585 nm lumiphors in the device, in the absence of any additional light, would have x, y color coordinates which are not within the area on a 1931 CIE Chromaticity Diagram enclosed by the first, second, third, fourth and fifth line segments defined above.

According to a fifth aspect of the present invention, there is provided a lighting device comprising:

a first group of light emitting diodes;

a first group of lumiphors; and a second group of light emitting diodes;

at least one power line directly or switchably electrically connected to the lighting device, wherein:

each of the first group of light emitting diodes, if illuminated, would emit light having a peak wavelength in the range of from 430 nm to 480 nm;

each of the first group of lumiphors, if excited, would emit light having a dominant wavelength in the range of from about 555 nm to about 585 nm;

each of the second group of light emitting diodes, if illuminated, would emit light having a dominant wavelength in the range of from 600 nm to 630 nm; and if power is supplied to each of the one or more power lines (e.g., by inserting into a standard 120 AC receptacle one or more power plugs which are electrically connected to one or more respective power lines), light would be emitted from the lighting device having x, y color coordinates which are within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38.

In some embodiments according to this aspect of the present invention, the lighting device can include additional 430 nm to 480 nm light emitting diodes which are not connected to any of the power lines (or are not connected to the power line) in the device, and in which, if such additional light emitting diodes were illuminated in addition to all of the light emitting diodes connected to the at least one power line, the combined light, in the absence of any additional light, would have x, y color coordinates which are not within the area on a 1931 CIE Chromaticity Diagram enclosed by the first, second, third, fourth and fifth line segments defined above.

According to a sixth aspect of the present invention, there is provided a lighting device comprising:

a first group of light emitting diodes;

a first group of lumiphors; and a second group of light emitting diodes;

wherein:

each of the first group of light emitting diodes, if illuminated, would emit light having a peak wavelength in the range of from 430 nm to 480 nm;

each of the first group of lumiphors, if excited, would emit light having a dominant wavelength in the range of from about 555 nm to about 585 nm;

each of the second group of light emitting diodes, if illuminated, would emit light having a dominant wavelength in the range of from 600 nm to 630 nm;

and wherein:

if (1) each of the first group of light emitting diodes is illuminated, (2) each of the first group of lumiphors is excited, and (3) each of the second group of light emitting diodes is illuminated, a mixture of light emitted from the first group of light emitting diodes, from the first group of lumiphors and from the second group of light emitting diodes would produce a first group-second group mixed illumination having x, y coordinates on a 1931 CIE Chromaticity Diagram which define a point which is within 10 MacAdam ellipses (or within 20 MacAdam ellipses, or within 40 MacAdam ellipses) of at least one point within the range of from about 2200K to about 4500K on the blackbody locus on a 1931 CIE Chromaticity Diagram.

In some embodiments according to this aspect of the present invention, the device can include additional 430 nm to 480 nm light emitting diodes which are not within the first group of light emitting diodes, and/or the device can include additional 555 nm to 585 nm lumiphors which are not within the first group of lumiphors, and/or the device can include additional 600 nm to 630 nm light emitting diodes which are not within the second group of light emitting diodes, wherein if any combination of such additional light emitting diodes were illuminated in addition to all of the light emitting diodes in the first group of light emitting diodes, all of the lumiphors in the first group of lumiphors and all of the light emitting diodes in the second group of light emitting diodes, would produce combined light having x, y coordinates on a 1931 CIE Chromaticity Diagram which define a point which is not within 10 MacAdam ellipses (or within 20 MacAdam ellipses, or within 40 MacAdam ellipses) of any point within the range of from about 2200K to about 4500K on the blackbody locus on a 1931 CIE Chromaticity Diagram.

In some embodiments according to this aspect of the present invention, the first group of light emitting diodes consists of all of the 430 nm to 480 nm light emitting diodes in the device, the first group of lumiphors consists of all of the 555 nm to 585 nm lumiphors in the device, and the second group of light emitting diodes consists of all of the 600 nm to 630 nm light emitting diodes in the device.

According to a seventh aspect of the present invention, there is provided a lighting device comprising:
a first group of light emitting diodes;
a first group of lumiphors; and
a second group of light emitting diodes;
wherein:
each of the first group of light emitting diodes, if illuminated, would emit light having a peak wavelength in the range of from 430 nm to 480 nm;
each of the first group of lumiphors, if excited, would emit light having a dominant wavelength in the range of from about 555 nm to about 585 nm;
each of the second group of light emitting diodes, if illuminated, would emit light having a dominant wavelength in the range of from 600 nm to 630 nm; and
and wherein:
if each of the first group of light emitting diodes is illuminated and each of the second group of light emitting diodes is illuminated, a mixture of light emitted from the first group of light emitting diodes, light emitted from the first group of lumiphors and light emitted from the second group of light emitting diodes would produce a first group-second group mixed illumination having x, y coordinates on a 1931 CIE Chromaticity Diagram which define a point which is within 10 MacAdam ellipses (or within 20 MacAdam ellipses, or within 40 MacAdam ellipses) of at least one point within the range of from about 2200K to about 4500K on the blackbody locus on a 1931 CIE Chromaticity Diagram.

In some embodiments according to this aspect of the invention, at least some of the lumiphors in the first group of lumiphors are excited by light emitted from the first group of light emitting diodes.

In some embodiments according to this aspect of the present invention, the lighting device might include additional lumiphors which would not be excited by light emitted from any of the light emitting diodes in the first group of light emitting diodes, even when all of the light emitting diodes in the first group of light emitting diodes are emitting light.

In some embodiments according to this aspect of the present invention, the lighting device can include additional lumiphors (1) which would not be excited by light emitted from any of the light emitting diodes in the first group of light emitting diodes and (2) which, if such additional lumiphors were excited in addition to all of the light emitting diodes in the first group of light emitting diodes and all of the light emitting diodes in the second group of light emitting diodes, would produce combined light having x, y coordinates on a 1931 CIE Chromaticity Diagram which define a point which is not within 10 MacAdam ellipses (or within 20 MacAdam ellipses, or within 40 MacAdam ellipses) of any point within the range of from about 2200K to about 4500K on the blackbody locus on a 1931 CIE Chromaticity Diagram.

According to an eighth aspect of the present invention, there is provided a lighting device comprising:
a first group of light emitting diodes;
a first group of lumiphors; and
a second group of light emitting diodes;
at least one power line directly or switchably electrically connected to the lighting device,
wherein:
each of the first group of light emitting diodes, if illuminated, would emit light having a peak wavelength in the range of from 430 nm to 480 nm;
each of the first group of lumiphors, if excited, would emit light having a dominant wavelength in the range of from about 555 nm to about 585 nm;
each of the second group of light emitting diodes, if illuminated, would emit light having a dominant wavelength in the range of from 600 nm to 630 nm; and
if power is supplied to at least one of the at least one power line, a mixture of light emitted from the first group of light emitting diodes, from the first group of lumiphors and from the second group of light emitting diodes would produce a first group-second group mixed illumination having x, y coordinates on a 1931 CIE Chromaticity Diagram which define a point which is within 10 MacAdam ellipses (or within 20 MacAdam ellipses, or within 40 MacAdam ellipses) of at least one point within the range of from about 2200K to about 4500K on the blackbody locus on a 1931 CIE Chromaticity Diagram.

In some embodiments according to this aspect of the present invention, the lighting device can include one or more additional 430 nm to 480 nm light emitting diodes, and/or one or more additional 600 nm to 630 nm light emitting diodes, which are not connected to the at least one power line (but which might be connected to some other power line), and in which, if such additional 430 nm to 480 nm light emitting diode(s) and/or such additional 600 nm to 630 nm light emitting diode(s) were illuminated in addition to all of the 430 nm to 480 nm light emitting diodes and all of the 600 nm to 630 nm light emitting diodes connected to the at least one power line, the combined light emitted, in the absence of any additional light, would have x, y coordinates on a 1931 CIE Chromaticity Diagram which define a point which is not within 10 MacAdam ellipses (or within 20 MacAdam ellipses, or within 40 MacAdam ellipses) of any point within the range of from about 2200K to about 4500K on the blackbody locus on a 1931 CIE Chromaticity Diagram.

According to a ninth aspect of the present invention, there is provided a lighting device comprising:
a first group of light emitting diodes;
a first group of lumiphors;
a second group of light emitting diodes; and
at least one power line directly or switchably electrically connected to the lighting device,
wherein:
each of the first group of light emitting diodes, if illuminated, would emit light having a peak wavelength in the range of from 430 nm to 480 nm;
each of the first group of lumiphors, if excited, would emit light having a dominant wavelength in the range of from about 555 nm to about 585 nm;

each of the second group of light emitting diodes, if illuminated, would emit light having a dominant wavelength in the range of from 600 nm to 630 nm; and if power is supplied to each of the at least one power line, a mixture of light emitted from the first group of light emitting diodes, from the first group of lumiphors and from the second group of light emitting diodes would produce a first group-second group mixed illumination having x, y coordinates on a 1931 CIE Chromaticity Diagram which define a point which is within 10 MacAdam ellipses (or within 20 MacAdam ellipses, or within 40 MacAdam ellipses) of at least one point within the range of from about 2200K to about 4500K on the blackbody locus on a 1931 CIE Chromaticity Diagram.

In some embodiments according to this aspect of the present invention, the lighting device can include additional 430 nm to 480 nm light emitting diodes and/or additional 600 nm to 630 nm light emitting diodes which are not connected to any of the power lines (or are not connected to the power line) in the device, and in which, if any of such additional light emitting diodes were illuminated in addition to all of the light emitting diodes connected to the at least one power line, the combined light, in the absence of any additional light, would have x, y coordinates on a 1931 CIE Chromaticity Diagram which define a point which is not within 10 MacAdam ellipses (or within 20 MacAdam ellipses, or within 40 MacAdam ellipses) of any point within the range of from about 2200K to about 4500K on the blackbody locus on a 1931 CIE Chromaticity Diagram.

According to a tenth aspect of the present invention, there is provided a lighting device comprising:
a first group of light emitting diodes;
a first group of lumiphors; and
a second group of light emitting diodes;
wherein:
each of the first group of light emitting diodes, if illuminated, would emit light having a peak wavelength in the range of from 430 nm to 480 nm;
each of the first group of lumiphors, if excited, would emit light having a dominant wavelength in the range of from about 555 nm to about 585 nm;
each of the second group of light emitting diodes, if illuminated, would emit light having a dominant wavelength in the range of from 600 nm to 630 nm;
and wherein:
if each of the first group of light emitting diodes is illuminated and each of the first group of lumiphors is excited, a mixture of light emitted from the first group of light emitting diodes and the first group of lumiphors, in the absence of any other light, would have a first group mixed illumination having x, y color coordinates which are within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38; and if (1) each of the first group of light emitting diodes is illuminated, (2) each of the first group of lumiphors is excited, and (3) each of the second group of light emitting diodes is illuminated, a mixture of light emitted from the first group of light emitting diodes, from the first group of lumiphors and from the second group of light emitting diodes would produce a first group-second group mixed illumination having x, y coordinates on a 1931 CIE Chromaticity Diagram which define a point which is within 10 MacAdam ellipses (or within 20 MacAdam ellipses, or within 40 MacAdam ellipses) of at least one point within the range of from about 2200K to about 4500K on the blackbody locus on a 1931 CIE Chromaticity Diagram.

In some embodiments according to this aspect of the present invention (and other aspects of the present invention), the device can include additional 430 nm to 480 nm light emitting diodes which are not within the first group of light emitting diodes, and/or the device can include additional 555 nm to 585 nm lumiphors which are not within the first group of lumiphors, and/or the device can include additional 600 nm to 630 nm light emitting diodes which are not within the second group of light emitting diodes.

In some embodiments according to this aspect of the present invention (and other aspects of the present invention), the first group of light emitting diodes consists of all of the 430 nm to 480 nm light emitting diodes in the device, the first group of lumiphors consists of all of the 555 nm to 585 nm lumiphors in the device, and the second group of light emitting diodes consists of all of the 600 nm to 630 nm light emitting diodes in the device.

According to an eleventh aspect of the present invention, there is provided a lighting device comprising:
a first group of light emitting diodes;
a first group of lumiphors; and
a second group of light emitting diodes;
wherein:
each of the first group of light emitting diodes, if illuminated, would emit light having a peak wavelength in the range of from 430 nm to 480 nm;
each of the first group of lumiphors, if excited, would emit light having a dominant wavelength in the range of from about 555 nm to about 585 nm;
each of the second group of light emitting diodes, if illuminated, would emit light having a dominant wavelength in the range of from 600 nm to 630 nm; and
and wherein:
if each of the first group of light emitting diodes is illuminated and each of the first group of lumiphors is excited, a mixture of light emitted from the first group of light emitting diodes and the first group of lumiphors, in the absence of any other light, would have a first group mixed illumination having x, y color coordinates which are within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38; and if each of the first group of light emitting diodes is illuminated and each of the second group of light emitting diodes is illuminated, a mixture of light emitted from the first group of light emitting diodes, light emitted from the first group of lumiphors and light emitted from the second group of light emitting diodes would produce a first group-second group mixed illumination having x, y coordinates on a 1931 CIE Chromaticity Diagram which define a point which is within 10 MacAdam ellipses (or within 20 MacAdam ellipses, or within 40 MacAdam ellipses) of at least one point within the range of from about 2200K to about 4500K on the blackbody locus on a 1931 CIE Chromaticity Diagram.

In some embodiments according to this aspect of the present invention (and other aspects of the present invention), the device can include additional 430 nm to 480 nm light emitting diodes which are not within the first group of light emitting diodes, and/or the device can include additional 555 nm to 585 nm lumiphors which are not within the first group of lumiphors, and/or the device can include additional 600 nm to 630 nm light emitting diodes which are not within the second group of light emitting diodes.

In some embodiments according to this aspect of the present invention (and other aspects of the present invention), the first group of light emitting diodes consists of all of the 430 nm to 480 nm light emitting diodes in the device, the first group of lumiphors consists of all of the 555 nm to 585 nm lumiphors in the device, and the second group of light emitting diodes consists of all of the 600 nm to 630 nm light emitting diodes in the device.

According to a twelfth aspect of the present invention, there is provided a lighting device comprising:
  a first group of light emitting diodes;
  a first group of lumiphors; and
  a second group of light emitting diodes;
  at least one power line directly or switchably electrically connected to the lighting device,
  wherein:
    each of the first group of light emitting diodes, if illuminated, would emit light having a peak wavelength in the range of from 430 nm to 480 nm;
    each of the first group of lumiphors, if excited, would emit light having a dominant wavelength in the range of from about 555 nm to about 585 nm;
    each of the second group of light emitting diodes, if illuminated, would emit light having a dominant wavelength in the range of from 600 nm to 630 nm; and
    if power is supplied to at least one of the at least one power line, a mixture of light emitted from the first group of light emitting diodes and the first group of lumiphors, in the absence of any other light, would have a first group mixed illumination having x, y color coordinates which are within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38;
    if power is supplied to at least one of the at least one power line, a mixture of light emitted from the first group of light emitting diodes, from the first group of lumiphors and the second group of light emitting diodes would produce a first group-second group mixed illumination having x, y coordinates on a 1931 CIE Chromaticity Diagram which define a point which is within 10 MacAdam ellipses (or within 20 MacAdam ellipses, or within 40 MacAdam ellipses) of at least one point within the range of from about 2200K to about 4500K on the blackbody locus on a 1931 CIE Chromaticity Diagram.

In some embodiments according to this aspect of the present invention (and other aspects of the present invention), the device can include additional 430 nm to 480 nm light emitting diodes which are not connected to the at least one power line, and/or the device can include additional 600 nm to 630 nm light emitting diodes which are not connected to the at least one power line.

In some embodiments according to this aspect of the present invention (and other aspects of the present invention), the first group of light emitting diodes consists of all of the 430 nm to 480 nm light emitting diodes in the device, the first group of lumiphors consists of all of the 555 nm to 585 nm lumiphors in the device, and the second group of light emitting diodes consists of all of the 600 nm to 630 nm light emitting diodes in the device.

According to a thirteenth aspect of the present invention, there is provided a lighting device comprising:
  a first group of light emitting diodes;
  a first group of lumiphors;
  a second group of light emitting diodes; and
  at least one power line directly or switchably electrically connected to the lighting device,
  wherein:
    each of the first group of light emitting diodes, if illuminated, would emit light having a peak wavelength in the range of from 430 nm to 480 nm;
    each of the first group of lumiphors, if excited, would emit light having a dominant wavelength in the range of from about 555 nm to about 585 nm;
    each of the second group of light emitting diodes, if illuminated, would emit light having a dominant wavelength in the range of from 600 nm to 630 nm; and
    if power is supplied to each of the at least one power line, a mixture of light emitted from the first group of light emitting diodes and the first group of lumiphors, in the absence of any other light, would have a first group mixed illumination having x, y color coordinates which are within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38; and
    if power is supplied to each of the at least one power line, a mixture of light emitted from the first group of light emitting diodes, from the first group of lumiphors and from the second group of light emitting diodes would produce a first group-second group mixed illumination having x, y coordinates on a 1931 CIE Chromaticity Diagram which define a point which is within 10 MacAdam ellipses (or within 20 MacAdam ellipses, or within 40 MacAdam ellipses) of at least one point within the range of from about 2200K to about 4500K on the blackbody locus on a 1931 CIE Chromaticity Diagram.

In some embodiments according to this aspect of the present invention (and other aspects of the present invention), the device can include additional 430 nm to 480 nm light emitting diodes which are not connected to the at least one power line, and/or the device can include additional 600 nm to 630 nm light emitting diodes which are not connected to the at least one power line.

In some embodiments according to this aspect of the present invention (and other aspects of the present invention), the first group of light emitting diodes consists of all of the 430 nm to 480 nm light emitting diodes in the device, the first group of lumiphors consists of all of the 555 nm to 585 nm lumiphors in the device, and the second group of light emitting diodes consists of all of the 600 nm to 630 nm light emitting diodes in the device.

In accordance with the present invention, it has further been determined that an effective lighting device for use in generating light which can readily be mixed with light emitted from a 600 nm to 630 nm light emitting diode comprises:
 a first group of light emitting diodes; and
 a first group of lumiphors;
 wherein:
  each of the first group of light emitting diodes, if illuminated, would emit light having a peak wavelength in the range of from 430 nm to 480 nm;
  each of the first group of lumiphors, if excited, would emit light having a dominant wavelength in the range of from about 555 inn to about 585 nm; and
  if each of the first group of light emitting diodes is illuminated and each of the first group of lumiphors is excited, a mixture of light emitted from the first group of light emitting diodes and the first group of lumiphors would, in the absence of any additional light, have a first group mixed illumination having x, y color coordinates which are within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38.

Accordingly, in a fourteenth aspect of the present invention, there is provided a lighting device comprising:
 a first group of light emitting diodes; and
 a first group of lumiphors;
 wherein:
  each of the first group of light emitting diodes, if illuminated, would emit light having a peak wavelength in the range of from 430 nm to 480 nm;
  each of the first group of lumiphors, if excited, would emit light having a dominant wavelength in the range of from about 555 nm to about 585 nm; and
  if each of the first group of light emitting diodes is illuminated and each of the first group of lumiphors is excited, a mixture of light emitted from the first group of light emitting diodes and the first group of lumiphors would, in the absence of any additional light, have a first group mixed illumination having x, y color coordinates which are within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38.

In some embodiments according to this aspect of the present invention, the device can include additional 430 nm to 480 nm light emitting diodes which are not within the first group of light emitting diodes, and/or the device can include additional 555 nm to 585 nm lumiphors which are not within the first group of lumiphors, including wherein if any of such additional light emitting 430 nm to 480 nm diodes and/or 555 nm to 585 nm lumiphors were illuminated or excited in addition to all of the light emitting diodes in the first group of light emitting diodes and all of the lumiphors in the first group of lumiphors, there would be produced combined light having x, y color coordinates which are not within the area on a 1931 CIE Chromaticity Diagram enclosed by the first, second, third, fourth and fifth line segments defined above.

In some embodiments according to this aspect of the present invention, the first group of light emitting diodes consists of all of the 430 nm to 480 nm light emitting diodes in the device, the first group of lumiphors consists of all of the 555 nm to 585 nm lumiphors in the device, and the second group of light emitting diodes consists of all of the 600 nm to 630 nm light emitting diodes in the device.

According to a fifteenth aspect of the present invention, there is provided a lighting device comprising:
 a first group of light emitting diodes; and
 a first group of lumiphors;
 wherein:
  each of the first group of light emitting diodes, if illuminated, would emit light having a peak wavelength in the range of from 430 nm to 480 nm;
  each of the first group of lumiphors, if excited, would emit light having a dominant wavelength in the range of from about 555 nm to about 585 nm; and
  if each of the first group of light emitting diodes is illuminated, a mixture of light emitted from the first group of light emitting diodes and the first group of lumiphors would, in the absence of any additional light, have a first group mixed illumination having x, y color coordinates which are within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38.

In some embodiments according to this aspect of the present invention, the device can include additional 430 nm to 480 nm light emitting diodes which are not within the first group of light emitting diodes, and/or the device can include additional 555 nm to 585 nm lumiphors which are not within the first group of lumiphors, including wherein if any of such additional light emitting diodes and/or lumiphors were illuminated or excited in addition to all of the light emitting diodes in the first group of light emitting diodes and all of the lumiphors in the first group of lumiphors, there would be produced combined light having x, y color coordinates which are not within the area on a 1931 CIE Chromaticity Diagram enclosed by the first, second, third, fourth and fifth line segments defined above.

According to a sixteenth aspect of the present invention, there is provided a lighting device comprising:
 a first group of light emitting diodes; and
 a first group of lumiphors;
 wherein:
  each of the first group of light emitting diodes, if illuminated, would emit light having a peak wavelength in the range of from 430 nm to 480 nm; and
  each of the first group of lumiphors, if excited, would emit light having a dominant wavelength in the range of from about 555 nm to about 585 nm.

In some embodiments according to this aspect of the present invention (and other aspects of the present invention), the device can include additional 430 nm to 480 nm light emitting diodes which are not within the first group of light emitting diodes, and/or the device can include additional 555 nm to 585 nm lumiphors which are not within the first group of lumiphors.

In some embodiments according to this aspect of the present invention (and other aspects of the present invention), the first group of light emitting diodes consists of all of the 430 nm to 480 nm light emitting diodes in the device and the first group of lumiphors consists of all of the 555 nm to 585 nm lumiphors in the device.

According to a seventeenth aspect of the present invention, there is provided a lighting device comprising:
 a first group of light emitting diodes;
 a first group of lumiphors; and
 at least one power line directly or switchably electrically connected to the lighting device,
 wherein:
  each of the first group of light emitting diodes, if illuminated, would emit light having a peak wavelength in the range of from 430 nm to 480 nm;
  each of the first group of lumiphors, if excited, would emit light having a dominant wavelength in the range of from about 555 nm to about 585 nm; and
  if power is supplied to at least one of the at least one power line, a mixture of light would be emitted from the first group of light emitting diodes and the first group of lumiphors which would, in the absence of any additional light, have a first group mixed illumination having x, y color coordinates which are within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38.

In some embodiments according to this aspect of the present invention, the lighting device can include one or more additional 430 nm to 480 nm light emitting diodes which are not connected to the at least one power line (but which might be connected to some other power line), and in which, if such additional 430 nm to 480 nm light emitting diode(s) were illuminated in addition to all of the 430 nm to 480 nm light emitting diodes connected to the at least one power line, the combined light emitted from all of the 430 nm to 480 nm light emitting diodes in the device and the 555 nm to 585 nm lumiphors in the device, in the absence of any additional light, would have x, y color coordinates which are not within the area on a 1931 CIE Chromaticity Diagram enclosed by the first, second, third, fourth and fifth line segments defined above.

According to an eighteenth aspect of the present invention, there is provided a lighting device comprising:
 a first group of light emitting diodes;
 a first group of lumiphors; and
 at least one power line directly or switchably electrically connected to the lighting device,
 wherein:
  each of the first group of light emitting diodes, if illuminated, would emit light having a peak wavelength in the range of from 430 nm to 480 nm;
  each of the first group of lumiphors, if excited, would emit light having a dominant wavelength in the range of from about 555 nm to about 585 nm; and
  if power is supplied to each of the at least one power line, light would be emitted from the lighting device having x, y color coordinates which are within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38.

In some embodiments according to this aspect of the present invention, the lighting device can include additional 430 nm to 480 nm light emitting diodes which are not connected to any of the power lines (or are not connected to the power line) in the device, and in which, if such additional light emitting diodes were illuminated in addition to all of the light emitting diodes connected to the at least one power line, the combined light, in the absence of any additional light, would have x, y color coordinates which are not within the area on a 1931 CIE Chromaticity Diagram enclosed by the first, second, third, fourth and fifth line segments defined above.

According to a nineteenth aspect of the present invention, there is provided a method of lighting, comprising:
 mixing light from a first group of at least one light emitting diode, light from a first group of at least one lumiphor and light from a second group of at least one light emitting diode to form mixed light;
 the light from each of the first group of at least one light emitting diode having a peak wavelength in the range of from 430 nm to 480 nm;

the light from each of the first group of at least one lumiphor having a dominant wavelength in the range of from 555 nm to 585 nm; the light from each of the second group of at least one light emitting diode having a dominant wavelength in the range of from 600 nm to 630 nm;

According to a twentieth aspect of the present invention, there is provided a method of lighting, comprising:

mixing light from at least one light emitting diode and at least one lumiphor to form mixed light, the light from each of the at least one light emitting diode having a peak wavelength in the range of from 430 nm to 480 nm;

the light from each of the at least one lumiphor having a dominant wavelength in the range of from 555 nm to 585 nm.

According to a twenty-first aspect of the present invention, there is provided an LED package, comprising:

an encapsulant element;

a light emitting diode which, if illuminated, would emit light having a peak wavelength in the range of from 430 nm to 480 nm; and a lumiphor which, if excited, would emit light having a dominant wavelength in the range of from about 555 nm to about 585 nm, wherein:

the light emitting diode and the lumiphor are embedded within the encapsulant element; and if the light emitting diode is illuminated, the lumiphor will be excited by the light emitting diode.

In some embodiments according to this aspect of the invention, if the light emitting diode is illuminated, a mixture of light would be emitted from the light emitting diode and the lumiphor which would, in the absence of any additional light, have a first group mixed illumination having x, y color coordinates which are within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38.

The light emitting diodes can be saturated or non-saturated. The term "saturated", as used herein, means having a purity of at least 85%, the term "purity" having a well-known meaning to persons skilled in the art, and procedures for calculating purity being well-known to those of skill in the art.

Figure 2:
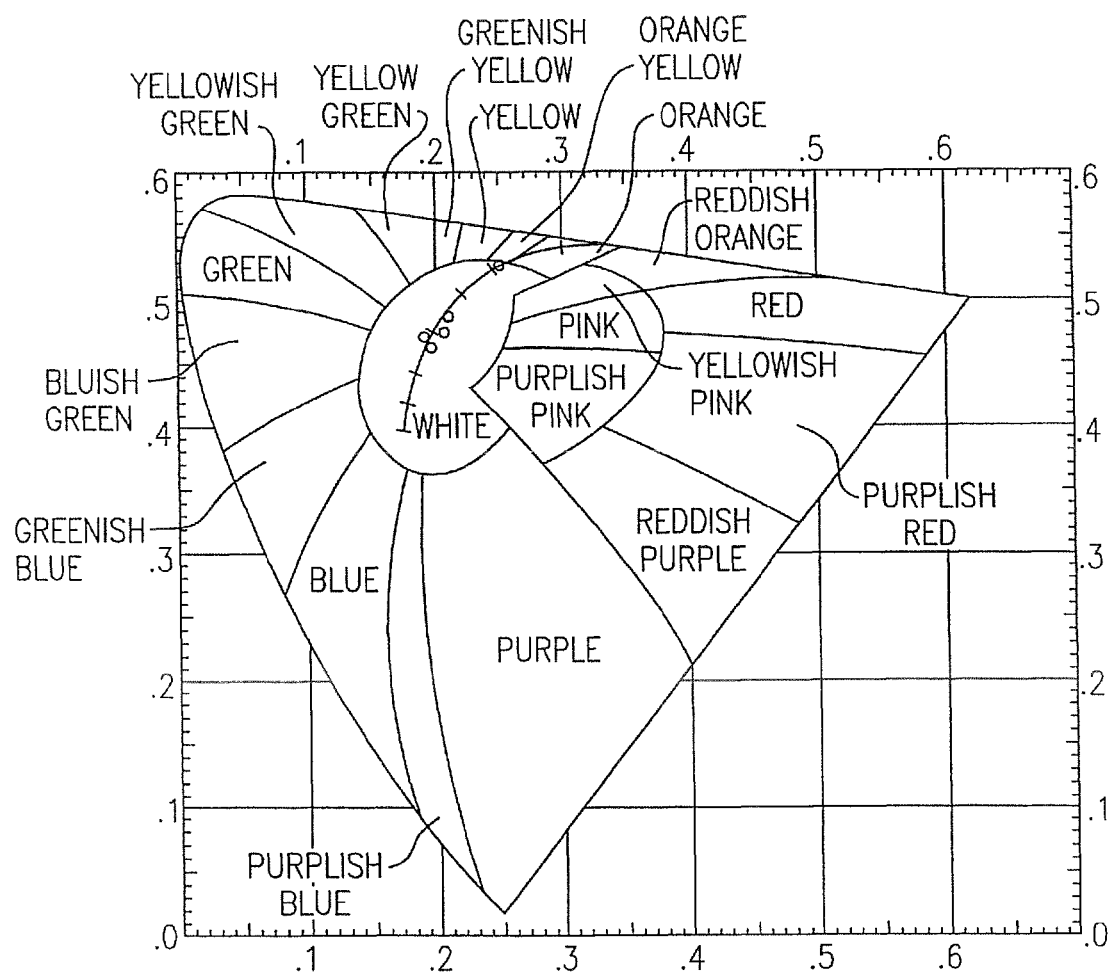
Figure 3:
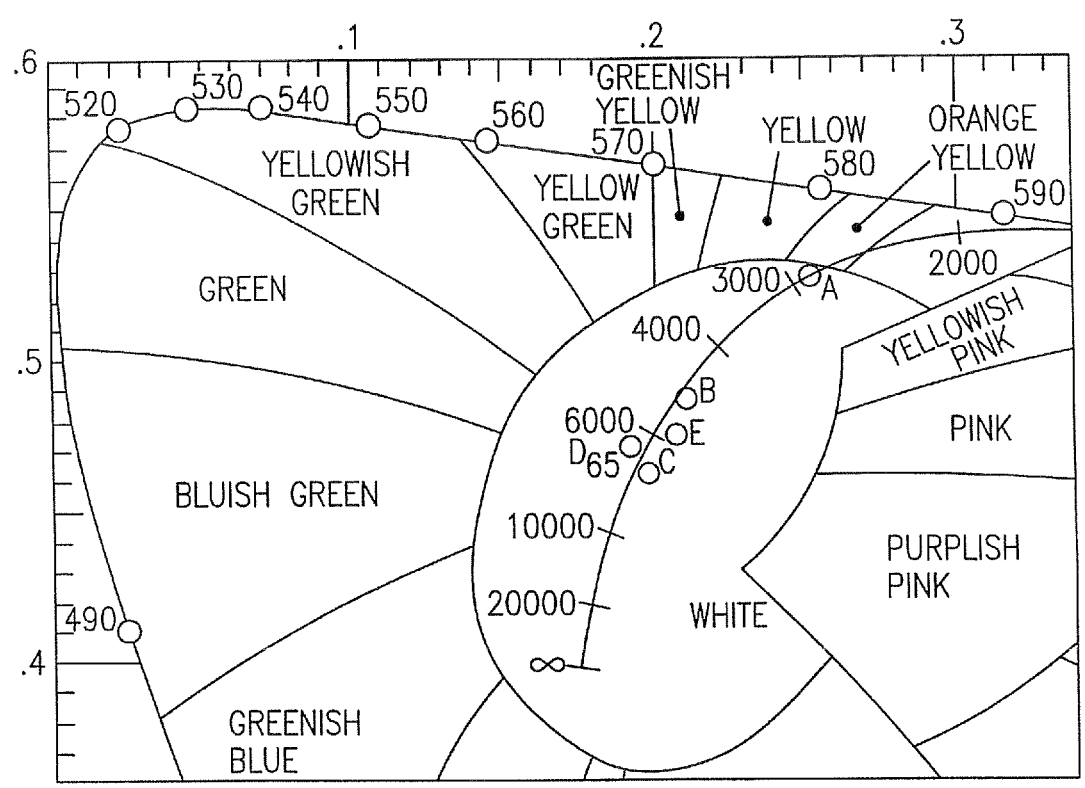

Aspects related to the present invention can be represented on either the 1931 CIE Chromaticity Diagram or the 1976 CIE Chromaticity Diagram. FIG. 1 shows the 1931 CIE Chromaticity Diagram. FIG. 2 shows the 1976 Chromaticity Diagram. FIG. 3 shows an enlarged portion of the 1976 Chromaticity Diagram, in order to show the blackbody locus in more detail. Persons of skill in the art are familiar with these diagrams, and these diagrams are readily available (e.g., by searching "CIE Chromaticity Diagram" on the internet).

The CIE Chromaticity Diagrams map out the human color perception in terms of two CIE parameters x and y (in the case of the 1931 diagram) or u' and v' (in the case of the 1976 diagram). For a technical description of CIE chromaticity diagrams, see, for example, "Encyclopedia of Physical Science and Technology", vol. 7, 230-231 (Robert A Meyers ed., 1987). The spectral colors are distributed around the edge of the outlined space, which includes all of the hues perceived by the human eye. The boundary line represents maximum saturation for the spectral colors. As noted above, the 1976 CIE Chromaticity Diagram is similar to the 1931 Diagram, except that the 1976 Diagram has been modified such that similar distances on the Diagram represent similar perceived differences in color.

In the 1931 Diagram, deviation from a point on the Diagram can be expressed either in terms of the coordinates or, alternatively, in order to give an indication as to the extent of the perceived difference in color, in terms of MacAdam ellipses. For example, a locus of points defined as being ten MacAdam ellipses from a specified hue defined by a particular set of coordinates on the 1931 Diagram consists of hues which would each be perceived as differing from the specified hue to a common extent (and likewise for loci of points defined as being spaced from a particular hue by other quantities of MacAdam ellipses).

Since similar distances on the 1976 Diagram represent similar perceived differences in color, deviation from a point on the 1976 Diagram can be expressed in terms of the coordinates, u' and v', e.g., distance from the point=$(\Delta u'^2+\Delta v'^2)^{1/2}$, and the hues defined by a locus of points which are each a common distance from a specified hue consist of hues which would each be perceived as differing from the specified hue to a common extent.

The chromaticity coordinates and the CIE chromaticity diagrams illustrated in FIGS. 1-3 are explained in detail in a number of books and other publications, such as pages 98-107 of K. H. Butler, "Fluorescent Lamp Phosphors" (The Pennsylvania State University Press 1980) and pages 109-110 of G. Blasse et al., "Luminescent Materials" (Springer-Verlag 1994), both incorporated herein by reference.

The chromaticity coordinates (i.e., color points) that lie along the blackbody locus obey Planck's equation: $E(\lambda)=A\lambda^{-5}/(e^{(B/T)}-1)$, where E is the emission intensity, $\lambda$ is the emission wavelength, T the color temperature of the blackbody and A and B are constants. Color coordinates that lie on or near the blackbody locus yield pleasing white light to a human observer. The 1976 CIE Diagram includes temperature listings along the blackbody locus. These temperature listings show the color path of a blackbody radiator that is caused to increase to such temperatures. As a heated object becomes incandescent, it first glows reddish, then yellowish, then white, and finally blueish. This occurs because the wavelength associated with the peak radiation of the blackbody radiator becomes progressively shorter with increased temperature, consistent with the Wien Displacement Law. Illuminants which produce light which is on or near the blackbody locus can thus be described in terms of their color temperature.

Also depicted on the 1976 CIE Diagram are designations A, B, C, D and E, which refer to light produced by several standard illuminants correspondingly identified as illuminants A, B, C, D and E, respectively.

CRI Ra is a modified average of the relative measurements of how the color rendition of an illumination system compares to that of a reference radiator when illuminating eight reference colors. The CRI Ra equals 100 if the color coordinates of a set of test colors being illuminated by the illumination system are the same as the coordinates of the same test colors being irradiated by the blackbody radiator.

The present invention may be more fully understood with reference to the accompanying drawings and the following detailed description of the invention.

BRIEF DESCRIPTION OF THE DRAWING FIGURES

Figure 4:
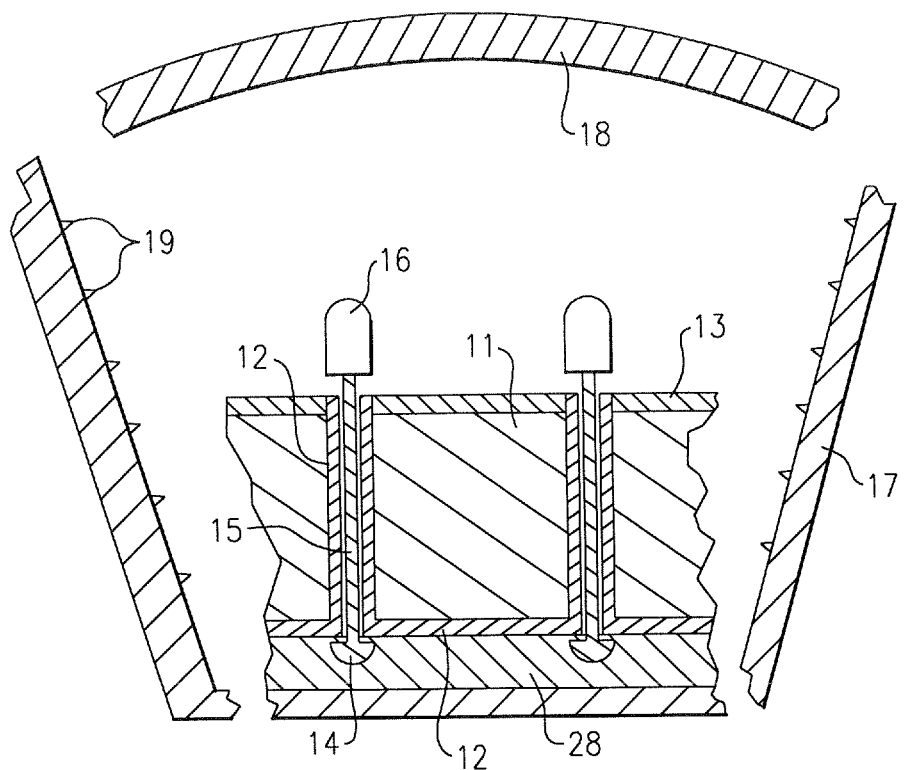
Figure 5:
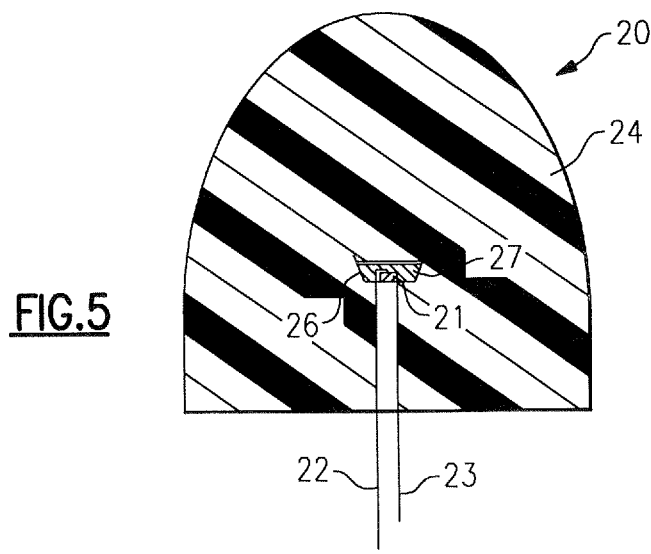

FIG. 1 shows the 1931 CIE Chromaticity Diagram.
FIG. 2 shows the 1976 Chromaticity Diagram.
FIG. 3 shows an enlarged portion of the 1976 Chromaticity Diagram, in order to show the blackbody locus in detail.
FIG. 4 is a schematic diagram of a representative example of a lighting device in accordance with the present invention.
FIG. 5 depicts a representative example of a packaged LED which can be used in the devices according to the present invention.

DETAILED DESCRIPTION OF THE INVENTION

The expression "correlated color temperature" is used according to its well-known meaning to refer to the temperature of a blackbody that is, in a well-defined sense (i.e., can be readily and precisely determined by those skilled in the art), nearest in color.

The expression "directly or switchably electrically connected" means "directly electrically connected" or "switchably electrically connected."

A statement herein that two components in a device are "directly electrically connected," means that there are no components electrically between the components, the insertion of which materially affect the function or functions provided by the device. For example, two components can be referred to as being electrically connected, even though they may have a small resistor between them which does not materially affect the function or functions provided by the device (indeed, a wire connecting two components can be thought of as a small resistor); likewise, two components can be referred to as being electrically connected, even though they may have an additional electrical component between them which allows the device to perform an additional function, while not materially affecting the function or functions provided by a device which is identical except for not including the additional component; similarly, two components which are directly connected to each other, or which are directly connected to opposite ends of a wire or a trace on a circuit board, are electrically connected.

A statement herein that two components in a device are "switchably electrically connected" means that there is a switch located between the two components, the switch being selectively closed or opened, wherein if the switch is closed, the two components are directly electrically connected, and if the switch is open (i.e., during any time period that the switch is open), the two components are not electrically connected.

The expression "illuminated", as used herein when referring to a light emitting diode, means that at least some current is being supplied to the light emitting diode to cause the light emitting diode to emit at least some light. The expression "illuminated" encompasses situations where the light emitting diode emits light continuously or intermittently at a rate such that a human eye would perceive it as emitting light continuously, or where a plurality of light emitting diodes of the same color or different colors are emitting light intermittently and/or alternatingly (with or without overlap in "on" times) in such a way that a human eye would perceive them as emitting light continuously (and, in cases where different colors are emitted, as a mixture of those colors).

The expression "excited", as used herein when referring to a lumiphor, means that at least some electromagnetic radiation (e.g., visible light, UV light or infrared light) is contacting the lumiphor, causing the lumiphor to emit at least some light. The expression "excited" encompasses situations where the lumiphor emits light continuously or intermittently at a rate such that a human eye would perceive it as emitting light continuously, or where a plurality of lumiphors of the same color or different colors are emitting light intermittently and/or alternatingly (with or without overlap in "on" times) in such a way that a human eye would perceive them as emitting light continuously (and, in cases where different colors are emitted, as a mixture of those colors).

The light emitting diode (or light emitting diodes) used in the devices according to the present invention, and the lumiphor (or lumiphors) used in the devices according to the present invention, can be selected from among any light emitting diodes and lumiphors known to persons of skill in the art. Wide varieties of such light emitting diodes and lumiphors are readily obtainable and well known to those of skilled in the art, and any of them can be employed (e.g., AlInGaP for the 600 nm to 630 nm light emitting diodes).

Examples of types of such light emitting diodes include inorganic and organic light emitting diodes, a variety of each of which are well-known in the art.

The one or more luminescent materials can be any desired luminescent material. The one or more luminescent materials can be down-converting or up-converting, or can include a combination of both types. For example, the one or more luminescent materials can be selected from among phosphors, scintillators, day glow tapes, inks which glow in the visible spectrum upon illumination with ultraviolet light, etc.

The one or more luminescent materials can be provided in any desired form. For example, the luminescent element can be embedded in a resin (i.e., a polymeric matrix), such as a silicone material or an epoxy. Additionally, the luminescent material may be embedded in a substantially transparent glass or metal oxide material.

The one or more lumiphors can individually be any lumiphor, a wide variety of which, as noted above, are known to those skilled in the art. For example, the or each lumiphor can comprise (or can consist essentially of, or can consist of) one or more phosphor. The or each of the one or more lumiphors can, if desired, further comprise (or consist essentially of, or consist of) one or more highly transmissive (e.g., transparent or substantially transparent, or somewhat diffuse) binder, e.g., made of epoxy, silicone, glass or any other suitable material (for example, in any given lumiphor comprising one or more binder, one or more phosphor can be dispersed within the one or more binder). For example, the thicker the lumiphor, in general, the lower the weight percentage of the phosphor can be. Representative examples of the weight percentage of phosphor include from about 3.3 weight percent to about 4.7 weight percent, although, as indicated above, depending on the overall thickness of the lumiphor, the weight percentage of the phosphor could be generally any value, e.g., from 0.1 weight percent to 100 weight percent (e.g., a lumiphor formed by subjecting pure phosphor to a hot isostatic pressing procedure). In some situations, a weight percentage of about 20 weight percent is advantageous.

The or each of the one or more lumiphors can, independently, further comprise any of a number of well-known additives, e.g., diffusers, scatterers, tints, etc.

In some embodiments of the present invention, different power lines (i.e., any structure which can carry electrical energy to a light emitting diode) are electrically connected (directly or switchably) to light emitting diodes of the different groups, and the relative quantities of light emitting diodes connected to the respective power lines differ from one power line to the next, e.g., a first power line contains a first percentage of 430 nm to 480 nm light emitting diodes and a second power line contains a second percentage (different from the first percentage) of 430 nm to 480 nm light emitting diodes. As a representative example, first and second power lines each contain 100% 430 nm to 480 nm light emitting diodes, and a third power line contains 50% 430 nm to 480 nm light emitting diodes and 50% 600 nm to 630 nm light emitting diodes. By doing so, it is possible to easily adjust the relative intensities of the light of the respective wavelengths, and thereby effectively navigate within the CIE Diagram and/or compensate for other changes. For example, the intensity of red light can be increased, when necessary, in order to compensate for any reduction of the intensity of the light generated by the 600 nm to 630 nm light emitting diodes. Thus, for instance, in the representative example described above, by increasing the current supplied to the third power line, or by decreasing the current supplied to the first power line and/or second power line (and/or by interrupting the supply of power to the first power line or the second power line), the x, y coordinates of the mixed light emitted from the lighting device can be appropriately adjusted.

In some embodiments of the present invention, there are further provided one or more current adjusters directly or switchably electrically connected to one or more of respective power lines which are electrically connected to light emitting diodes, whereby the current adjuster can be adjusted to adjust the current supplied to the respective light emitting diode(s).

In some embodiments of the present invention, there are further provided one or more switches electrically connected to one of respective power lines, whereby the switch selectively switches on and off current to the light emitting diode (s) on the respective power line.

In some embodiments of the present invention, one or more current adjusters and/or one or more switches automatically interrupt and/or adjust current passing through one or more respective power lines in response to a detected change in the output from the lighting device (e.g., an extent of deviation from the blackbody locus) or in accordance with a desired pattern (e.g., based on the time of day or night, such as altering the correlated color temperature of the combined emitted light).

In some embodiments of the present invention, there are further provided one or more thermistors which detect temperature and, as temperature changes, cause one or more current adjusters and/or one or more switches to automatically interrupt and/or adjust current passing through one or more respective power lines in order to compensate for such temperature change. In general, 600 nm to 630 nm light emitting diodes get dimmer as their temperature increases—in such embodiments, fluctuations in intensity caused by such temperature variation can be compensated for.

In some lighting devices according to the present invention, there are further included one or more circuitry components, e.g., drive electronics for supplying and controlling current passed through at least one of the one or more light emitting diodes in the lighting device. Persons of skill in the art are familiar with a wide variety of ways to supply and control the current passed through light emitting diodes, and any such ways can be employed in the devices of the present invention. For example, such circuitry can include at least one contact, at least one leadframe, at least one current regulator, at least one power control, at least one voltage control, at least one boost, at least one capacitor and/or at least one bridge rectifier, persons of skill in the art being familiar with such components and being readily able to design appropriate circuitry to meet whatever current flow characteristics are desired.

The present invention further relates to an illuminated enclosure, comprising an enclosed space and at least one lighting device according to the present invention, wherein the lighting device illuminates at least a portion of the enclosure.

The present invention further relates to an illuminated surface, comprising a surface and at least one lighting device according to the present invention, wherein the lighting device illuminates at least a portion of the surface.

The present invention further relates to an illuminated area, comprising at least one area selected from among the group consisting of a structure, a swimming pool, a room, a warehouse, an indicator, a road, a vehicle, a road sign, a billboard, a ship, a boat, an aircraft, a stadium, a tree, a window, an LCD display, a cave or tunnel, and a lamppost having mounted therein or thereon at least one lighting device according to the present invention.

In addition, persons of skill in the art are familiar with a wide variety of mounting structures for many different types of lighting, and any such structures can be used according to the present invention. For example, FIG. 4 depicts a lighting device which includes a heat spreading element 11 (formed of a material with good heat conducting properties, e.g., aluminum), insulating regions 12 (which can be applied and/or formed in situ, e.g., by anodizing), a highly reflective surface 13 (which can be applied, e.g., MCPET, marketed by Furukawa of Japan, laminated aluminum or silver or formed in situ, e.g., by polishing), conductive traces 14, leadframes 15, packaged LED's 16, a reflective cone 17 and a diffusing element 18. The device depicted in FIG. 4 can further include an insulating element 28 below the conductive traces 14 to avoid unintended contact (e.g., a person receiving a shock) with the conductive traces. The device depicted in FIG. 4 can include any number of packaged LED's (e.g., up to 50 or 100 or more), and so the heat spreading element 11, as well as the insulating regions 12, reflective surface 13 and insulating element 28 can extend any necessary distance to the right or left, in the orientation shown in FIG. 4, as indicated by the fragmented structures (similarly, the sides of the reflective cone 17 can be located any distance to the right or left). Similarly, the diffusing element 18 can be located any desired distance from the LED's 16. The diffusing element 18 can be attached to the reflective cone 17, the insulating element 28, the heat spreading element 11, or any other desired structure in any suitable way, persons of skill in the art being familiar with and readily able to provide such attachment in a wide variety of ways. In this embodiment, and other embodiments, the heat spreading element 11 serves to spread out the heat, act as a heat sink, and/or dissipate the heat. Likewise, the reflective cone 17 functions as a heat sink. In addition, the reflective cone 17 can include ridges 19 to enhance its reflective properties.

FIG. 5 depicts a representative example of a packaged LED which can be used in the devices according to the present invention. Referring to FIG. 5, there is shown a lighting device 20 comprising a solid state light emitter 21 (in this case, a light emitting diode chip 21), a first electrode 22, a second electrode 23, an encapsulant region 24, a reflective element 26 in which the light emitting diode chip 21 is mounted and a lumiphor 27. A packaged LED which does not include any lumiphor (e.g., a 600 nm to 630 nm light emitting diode) can be constructed in a similar way but without the inclusion of a lumiphor 27. Persons of skill in the art are familiar with, and have ready access to, a wide variety of other packaged and unpackaged LED structures, any of which can, if desired, be employed according to the present invention.

In some embodiments according to the present invention, one or more of the light emitting diodes can be included in a package together with one or more of the lumiphors, and the one or more lumiphor in the package can be spaced from the one or more light emitting diode in the package to achieve improved light extraction efficiency, as described in U.S. Patent Application No. 60/753,138, filed on Dec. 22, 2005, entitled "Lighting Device" (inventor: Gerald H. Negley), the entirety of which is hereby incorporated by reference.

In some embodiments according to the present invention, two or more lumiphors can be provided, two or more of the lumiphors being spaced from each other, as described in U.S. Patent Application No. 60/761,310, filed on Jan. 23, 2006, entitled "Shifting Spectral Content in LEDs by Spatially Separating Lumiphor Films" (inventors: Gerald H. Negley and Antony Van De Ven), the entirety of which is hereby incorporated by reference.

In some lighting devices according to the present invention, there are further included one or more power sources, e.g., one or more batteries and/or solar cells, and/or one or more standard AC power plugs.

The lighting devices according to the present invention can comprise any desired number of LED's and lumiphors. For example, a lighting device according to the present invention can include 50 or more light emitting diodes, or can include 100 or more light emitting diodes, etc. In general, with current light emitting diodes, greater efficiency can be achieved by using a greater number of smaller light emitting diodes (e.g., 100 light emitting diodes each having a surface area of 0.1 mm$^2$ vs. 25 light emitting diodes each having a surface area of 0.4 mm$^2$ but otherwise being identical).

Analogously, light emitting diodes which operate at lower current densities are generally more efficient. Light emitting diodes which draw any particular current can be used according to the present invention. In one aspect of the present invention, light emitting diodes which each draw not more than 50 milliamps are employed.

Other embodiments may include fewer LEDs, as little as one each of blue and red, and such could be small chip LEDs or high power LEDs; and provided with sufficient heat sinking be operated at high currents. In the case of high power LEDs, operating up to 5 A is possible.

The sources of visible light in the lighting devices of the present invention can be arranged, mounted and supplied with electricity in any desired manner, and can be mounted on any desired housing or fixture. Skilled artisans are familiar with a wide variety of arrangements, mounting schemes, power supplying apparatuses, housings and fixtures, and any such arrangements, schemes, apparatuses, housings and fixtures can be employed in connection with the present invention. The lighting devices of the present invention can be electrically connected (or selectively connected) to any desired power source, persons of skill in the art being familiar with a variety of such power sources.

Representative examples of arrangements of sources of visible light, schemes for mounting sources of visible light, apparatus for supplying electricity to sources of visible light, housings for sources of visible light, fixtures for sources of visible light and power supplies for sources of visible light, all of which are suitable for the lighting devices of the present invention, are described in U.S. Patent Application No. 60/752,753, filed on Dec. 21, 2005, entitled "Lighting Device" (inventors: Gerald H. Negley, Antony Paul Ven de Ven and Neal Hunter), the entirety of which is hereby incorporated by reference.

The light emitting diodes and lumiphors can be arranged in any desired pattern. In some embodiments according to the present invention which include 600 nm to 630 nm (dominant wavelength) light emitting diodes as well as 430 nm to 480 nm (peak wavelength) light emitting diodes, some or all of the 600 are surrounded by five or six 430 nm to 480 nm light emitting diodes (some or all of which may or may not include 555 nm to 585 nm lumiphors), e.g., the 600 nm to 630 nm light emitting diodes and the 430 nm to 480 nm light emitting diodes are arranged in generally laterally arranged rows and spaced from one another substantially evenly, each row being laterally offset from the next adjacent (in a longitudinal direction) row by half the distance between laterally adjacent light emitting diodes, with, in most locations, two 430 nm to 480 nm light emitting diodes being located between each 600 nm to 630 nm light emitting diode and its nearest neighbor in the same row, and with the 600 nm to 630 nm light emitting diodes in each row being offset from the nearest 600 nm to 630 light emitting diode(s) in the next adjacent (in a longitudinal direction) row by one and a half times the distance between laterally spaced adjacent light emitting diodes. Alternatively or additionally, in some embodiments according to the present invention, some or all of the brighter light emitting diodes are placed closer to a center of the lighting device that the dimmer light emitting diodes. Generally, it is preferred that the location of the 430 nm to 480 nm (peak wavelength) light emitting diodes be arranged so that they are closer to the outside periphery of the fixture and that the 600 nm to 630 nm (dominant wavelength) light emitting diodes are arranged within the periphery of the fixture.

The devices according to the present invention can further comprise one or more long-life cooling device (e.g., a fan with an extremely high lifetime). Such long-life cooling device(s) can comprise piezoelectric or magnetorestrictive materials (e.g., MR, GMR, and/or HMR materials) that move air as a "Chinese fan". In cooling the devices according to the present invention, typically only enough air to break the boundary layer is required to induce temperature drops of 10 to 15 degrees C. Hence, in such cases, strong "breezes" or a large fluid flow rate (large CFM) are typically not required (thereby avoiding the need for conventional fans).

In some embodiments according to the present invention, any of the features, e.g., circuitry, as described in U.S. Patent Application No. 60/761,879, filed on Jan. 25, 2006, entitled "Lighting Device With Cooling" (inventors: Thomas Coleman, Gerald H. Negley and Antony Van De Ven), the entirety of which is hereby incorporated by reference, can be employed.

The devices according to the present invention can further comprise secondary optics to further change the projected nature of the emitted light. Such secondary optics are well-known to those skilled in the art, and so they do not need to be described in detail herein—any such secondary optics can, if desired, be employed.

The devices according to the present invention can further comprise sensors or charging devices or cameras, etc. For example, persons of skill in the art are familiar with, and have ready access to, devices which detect one or more occurrence (e.g., motion detectors, which detect motion of an object or person), and which, in response to such detection, trigger illumination of a light, activation of a security camera, etc. As a representative example, a device according to the present invention can include a lighting device according to the present invention and a motion sensor, and can be constructed such that (1) while the light is illuminated, if the motion sensor detects movement, a security camera is activated to record visual data at or around the location of the detected motion, or (2) if the motion sensor detects movement, the light is illuminated to light the region near the location of the detected motion and the security camera is activated to record visual data at or around the location of the detected motion, etc.

For indoor residential illumination a color temperature of 2700 K to 3500 K is normally preferred; for indoor illumination of commercial indoor locations such as office spaces and in general illumination in tropical geographic latitudes, an indoor color temperature of 3500 to 5000 K is often desired; and for outdoor flood lighting of colorful scenes a color temperature approximating daylight 5000 K (4500–6500 K) is preferred.

Any two or more structural parts of the lighting devices described herein can be integrated. Any structural part of the lighting devices described herein can be provided in two or more parts (which can be held together, if necessary).

The invention claimed is:

1. A lighting device comprising:
    at least one light source which, when illuminated, emits light which, in an absence of any additional light, has x, y color coordinates which define a point which is within a first area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38; and
    a first group of solid state light emitters, the first group of solid state light emitters comprising at least a first solid state light emitter, each of the first group of solid state light emitters, when illuminated, emitting light having a dominant emission wavelength in the range of from about 600 nm to about 630 nm.

2. A lighting device as recited in claim 1, wherein the first group of solid state light emitters comprises at least a first light emitting diode.

3. A lighting device as recited in claim 1, wherein the first group of solid state light emitters comprises at least a first luminescent material.

4. A lighting device as recited in claim 1, wherein said at least one light source, when illuminated, emits light which, in an absence of any additional light, has x, y color coordinates which define a point which is within a second area on a 1931 CIE Chromaticity Diagram enclosed by first, second, third and fourth line segments, said first line segment connecting a first point to a second point, said second line segment connecting said second point to a third point, said third line segment connecting said third point to a fourth point, said fourth line segment connecting said fourth point to said first point, said first point having x, y coordinates of 0.32, 0.40, said second point having x, y coordinates of 0.36, 0.48, said third point having x, y coordinates of 0.41, 0.455, and said fourth point having x, y coordinates of 0.36, 0.38.

5. A lighting device as recited in claim 1, wherein said at least one light source, when illuminated, emits light which, in an absence of any additional light, would have a CRI of at least 80.

6. A lighting device as recited in claim 1, wherein said lighting device has an efficacy of at least 25 lumens per watt.

7. A lighting device as recited in claim 1, wherein when (1) each of said at least one light source is illuminated, and (2) said first group of solid state light emitters is illuminated, a mixture of light emitted from said at least one light source and said first group of solid state light emitters would produce mixed illumination having x, y coordinates on a 1931 CIE Chromaticity Diagram which define a point which is within 40 MacAdam ellipses of at least one point within the range of from about 2200K to about 4500K on the blackbody locus on a 1931 CIF Chromaticity Diagram.

8. A lighting device as recited in claim 1, wherein when (1) each of said at least one light source is illuminated, and (2) said first group of solid state light emitters is illuminated, a mixture of light emitted from said at least one light source and said first group of solid state light emitters would produce mixed illumination having x, y coordinates on a 1931 CIE Chromaticity Diagram which define a point which is within 20 MacAdam ellipses of at least one point within the range of from about 2200K to about 4500K on the blackbody locus on a 1931 CIE Chromaticity Diagram.

9. A lighting device as recited in claim 1, wherein when (1) each of said at least one light source is illuminated, and (2) said first group of solid state light emitters is illuminated, a mixture of light emitted from said at least one light source and said first group of solid state light emitters would produce mixed illumination having x, y coordinates on a 1931 CIE Chromaticity Diagram which define a point which is within 10 MacAdam ellipses of at least one point within the range of from about 2200K to about 4500K on the blackbody locus on a 1931 CIE Chromaticity Diagram.

10. A lighting device as recited in claim 1, wherein when (1) each of said at least one light source is illuminated, and (2) said first group of solid state light emitters is illuminated, a mixture of light emitted from said at least one light source and said first group of solid state light emitters would produce mixed illumination having x, y coordinates on a 1931 CIE Chromaticity Diagram which define a point which is within five MacAdam ellipses of at least one point within the range of from about 2200K to about 4500K on the blackbody locus on a 1931 CIE Chromaticity Diagram.

11. A lighting device as recited in claim 1, wherein when (1) each of said at least one light source is illuminated, and (2) said first group of solid state light emitters is illuminated, a mixture of light emitted from said at least one light source and said first group of solid state light emitters would produce mixed illumination having x, y coordinates on a 1931 CIE Chromaticity Diagram which define a point which is within three MacAdam ellipses of at least one point within the range of from about 2200K to about 4500K on the blackbody locus on a 1931 CIE Chromaticity Diagram.

12. An LCD display device comprising:
    liquid crystals; and
    at least one light source that comprises at least a first group of solid state light emitters, a second group of solid state light emitters, and at least a first luminescent material, the first group of solid state light emitters comprising a first solid state light emitter; at least a first portion of light emitted from the first solid state light emitter being converted by the first luminescent material and at least a second portion of light emitted from the first solid state light emitter not being converted by the first luminescent material, the first portion of light and the second portion of light mixing to form mixed light which, in the absence of any other light, would be non-white light, the second group of solid state light emitters including at least one solid state light emitter; and
    when each of the first group of solid state light emitters is illuminated, and each of the second group of solid state light emitters is illuminated, a mixture of (1) light exiting the at least one light source which was emitted by the first group of solid state light emitters, (2) light exiting the at least one light source which was emitted by the first luminescent material and (3) light exiting the at least one light source which was emitted by the second group of solid state light emitters would produce a mixed illumination having x, y coordinates on a 1931 CIE Chromaticity Diagram which define a point which is within 40 MacAdam ellipses of at least one point on the blackbody locus on a 1931 CIE Chromaticity Diagram.

13. An LCD display device as recited in claim 12, wherein the first solid state light emitter and at least a portion of the first luminescent material are in a packaged device.

14. An LCD display device as recited in claim 12, wherein:
the first solid state light emitter, when illuminated, emits light having peak wavelength in the range of from 430 nm to 480 nm; and
the first luminescent material, when excited, emits light having a dominant wavelength in the range of from about 555 nm to about 585 nm.

15. An LCD display device comprising:
liquid crystals; and
at least one light source that comprises a first group of solid state light emitters,
a second group of solid state light emitters, and at least a first luminescent material, the first group of solid state light emitters comprising at least a first solid state light emitter, at least a first portion of light emitted from the first solid state light emitter being converted by the first luminescent material and at least a second portion of light emitted from the first solid state light emitter not being converted by the first luminescent material, the first portion of light and the second portion of light mixing form mixed light which in the absence of any other light, would be non-white light,
the second group of solid state light emitters including at least one solid state light emitter; and
when each of the first group of solid state light emitters is illuminated, and each of the second group of solid state light emitters is illuminated, a mixture of (1) light exiting the at least one light source which was emitted by the first group of solid state light emitters, (2) light exiting the at least one light source which was emitted by the first luminescent material and (3) light exiting the at least one light source which was emitted by the second group of solid state light emitters would produce a mixed illumination having x, y coordinates on a 1931 CIE Chromaticity Diagram which define a point which is within 10 MacAdam ellipses of at least one point on the blackbody locus on a 1931 CIE Chromaticity Diagram.

16. An LCD display device as recited in claim 15, wherein each of the second group of solid state light emitters, when illuminated, would emit light having a dominant wavelength in the range of from 600 nm to 630 nm.

17. An LCD display device as recited in claim 15, wherein at least a portion of the first luminescent material is in at least one lumiphor.

* * * * *